(12) United States Patent
Shim et al.

(10) Patent No.: US 11,691,891 B2
(45) Date of Patent: Jul. 4, 2023

(54) LAYERED GROUP III-V COMPOUND INCLUDING ADDITIVE ELEMENTS AND HAVING FERROELECTRIC-LIKE PROPERTIES, AND NANOSHEET USING THE SAME

(71) Applicant: Industry-Academic Cooperation Foundation, Yonsei University, Seoul (KR)

(72) Inventors: Woo-young Shim, Seoul (KR); Min-jung Kim, Gwangju (KR); Tae-young Kim, Seoul (KR); Hong Choi, Seongnam-si (KR); Jong-bum Won, Seoul (KR); Ji-hong Bae, Uiwang-si (KR); Sang-jin Choi, Seoul (KR); Bo-kyeong Kim, Namyangju-si (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 194 days.

(21) Appl. No.: 17/110,929

(22) Filed: Dec. 3, 2020

(65) Prior Publication Data

US 2022/0144661 A1  May 12, 2022

(30) Foreign Application Priority Data

Nov. 10, 2020  (KR) ........................ 10-2020-0149110

(51) Int. Cl.
| | |
|---|---|
| *C01G 28/00* | (2006.01) |
| *C01G 15/00* | (2006.01) |
| *C01G 30/00* | (2006.01) |
| *C01B 21/06* | (2006.01) |
| *C01B 25/08* | (2006.01) |
| *C30B 29/68* | (2006.01) |
| *C30B 29/40* | (2006.01) |

(52) U.S. Cl.
CPC ........ *C01G 28/002* (2013.01); *C01B 21/0602* (2013.01); *C01B 25/088* (2013.01); *C01G 15/006* (2013.01); *C01G 30/002* (2013.01); *C30B 29/40* (2013.01); *C30B 29/68* (2013.01); *C01P 2002/01* (2013.01); *C01P 2002/82* (2013.01); *C01P 2002/85* (2013.01); *C01P 2004/03* (2013.01); *C01P 2004/04* (2013.01); *C01P 2004/17* (2013.01)

(58) Field of Classification Search
CPC .. C01G 15/006; C01G 28/002; C01G 30/002; C01P 2004/17; C30B 29/40; C30B 29/68; B82Y 30/00; C01B 25/088; C01B 21/0602

See application file for complete search history.

(56) References Cited

U.S. PATENT DOCUMENTS

2019/0352799 A1   11/2019   Shim et al.

FOREIGN PATENT DOCUMENTS

| JP | 2011014640 A | 1/2011 |
|---|---|---|
| KR | 20190132148 A | 11/2019 |
| KR | 20190132152 A | 11/2019 |
| KR | 20190132294 A | 11/2019 |
| KR | 10-2057700 B1 | 12/2019 |

OTHER PUBLICATIONS

K. C. Hewitt et al. "Electrochemistry of InSb as a Li Insertion Host: Problems and Prospects", The Electrochemical Society,148 (5) A402-A410 (2001).

M. Stojic et al. "The Behaviour of Sodium In Ge,Si And GaAs", Physica 138B (1986), 125-128, North-Holland, Amsterdam.

Frederic Mertins, "European Search Report for EP Application No. 20211719.8", dated Jun. 1, 2021, EPO, Germany.

*Primary Examiner* — Steven J Bos
(74) *Attorney, Agent, or Firm* — Bridgeway IP Law Group, PLLC; Jihun Kim

(57) ABSTRACT

Proposed are a layered Group III-V compound having ferroelectric properties, a Group III-V compound nanosheet that may be prepared using the same, and an electrical device including the materials. Proposed is a layered compound represented by [Formula 1] $M_{x-m}A_yB_z$ (M is at least one of Group I or Group II elements, A is at least one of Group III elements, B is at least one of Group V elements, x, y, and z are positive numbers which are determined according to stoichiometric ratios to ensure charge balance when m is 0, and $0<m<x$), and having ferroelectric-like properties.

8 Claims, 31 Drawing Sheets

Sample A

Sample C

LAYERED GROUP III-V COMPOUND INCLUDING ADDITIVE ELEMENTS AND HAVING FERROELECTRIC-LIKE PROPERTIES, AND NANOSHEET USING THE SAME

BACKGROUND OF THE INVENTION

1. Field of the Invention

The present invention relates to a Group III-V compound having a layered structure, and more particularly, to a layered Group III-V compound including additive elements and having ferroelectric-like properties.

2. Description of the Related Art

Layered compounds connected to interlayers through van der Waals bonds may show various properties, and the layered compounds may be delaminated through physical or chemical methods to prepare two-dimensional (2D) nanosheets having a thickness of several to hundreds of nanometers, and thus, active research into the layered compounds is underway.

In particular, low-dimensional materials such as nanosheets are expected to have innovative new functions that existing bulk materials fail to provide, and are highly likely to serve as next-generation future materials instead of the existing materials.

However, up until now, the layered compounds having a two-dimensional crystal structure are limited to materials such as graphite, transition metals, and chalcogen compounds to hardly develop into materials of various compositions.

Meanwhile, Group III-V compounds are capable of controlling energy band gaps through various combinations of Group III elements and Group V elements to be used as various semiconductor materials, but Group III-V compounds having a layered structure as well as ferroelectric-like properties are not specifically known.

Unlike existing Group III-V compounds, the Group III-V compounds having a layered structure are expected to allow diversified application and to be applicable to new areas that have not been reached before.

RELATED ART DOCUMENT

Patent Document

Korean Registered Patent Publication No. 10-2057700
Korean Patent Laid-open Publication No. 2019-0132294
Korean Patent Laid-open Publication No. 2019-0132152

SUMMARY OF THE INVENTION

According to an embodiment of the invention, there are provided a layered Group III-V compound having ferroelectric-like properties, a Group III-V compound nanosheet that may be prepared using the same, and an electrical device including the materials.

According to a first aspect of the invention, there is provided a compound represented by Formula 1 below and having ferroelectric-like properties.

$$M_{x-m}A_yB_z \quad \text{[Formula 1]}$$

(M is at least one of Group I or Group II elements, A is at least one of Group III elements, B is at least one of Group V elements, x, y, and z are positive numbers, which are determined according to stoichiometric ratios to ensure charge balance when m is 0, and 0<m<x.

According to a second aspect of the invention, there is provided a nanosheet represented by Formula 1 above, including two or more compound layers, and having ferroelectric-like properties.

According to a third aspect of the invention, there is provided an electrical device including the layered compound of the first aspect or the nanosheet of the second aspect.

A layered compound and a nanosheet that may be provided through an embodiment of the invention may have a polar-symmetry structure as well as various electrical properties such as ferroelectric-like properties and resistance switching properties to be applicable to various electrical devices, and to developed into a memory device such as a memristor capable of storing information like a flash memory.

DETAILED DESCRIPTION OF THE EXEMPLARY EMBODIMENTS

Embodiments

Figure 1:
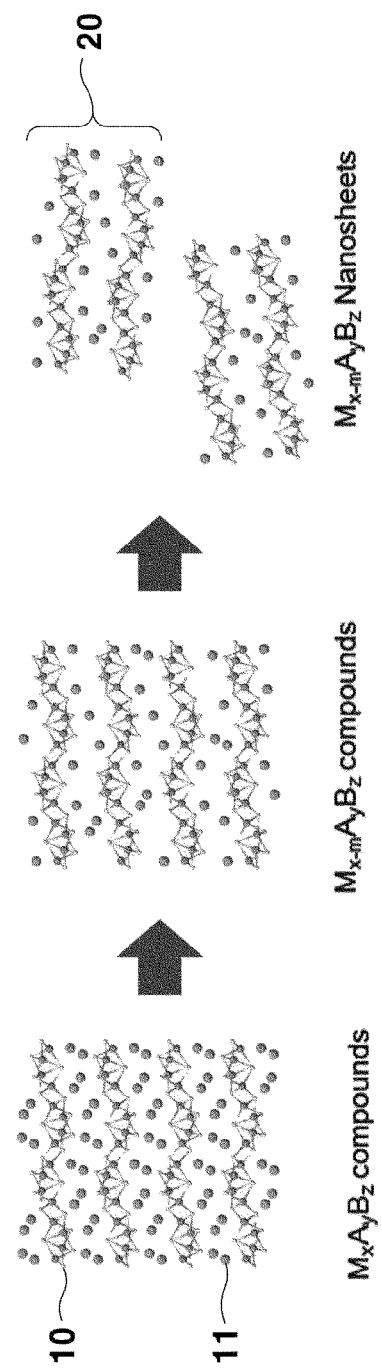
FIG. 1 is a conceptual view illustrating a layered compound according to an embodiment of the invention and a nanosheet prepared using the same.

Hereinafter, configuration and operation of embodiments of the invention will be described with reference to the accompanying drawings. In the following description, when it is determined that the specific description of the known related art unnecessarily obscures the gist of the invention, the detailed description thereof will be omitted. In addition, when an element "includes" a component, it may indicate that the element does not exclude another component unless explicitly described to the contrary, but can further include another component.

A compound according to an embodiment of the invention is represented by Formula 1 below and has ferroelectric-like properties.

[Formula 1]

(Where M is at least one of Group I or Group II elements, A is at least one of Group III elements, B is at least one of Group V elements, x, y, and z are positive numbers which are determined according to stoichiometric ratios to ensure charge balance when m is 0, and 0<m<x).

In addition, the compound of the invention has a layered structure, and in general, a Group III-V compound has a three-dimensional structure, having difficulty in exhibiting a layered structure. In order to overcome the limitation, inventors of the invention added Group I or Group II elements (hereinafter referred to as an "additive element") to a Group III-V compound to place the additive elements between Group III-V compound layers so as to prepare a layered compound in which the Group III-V compound layers are connected. The additive elements positioned between the Group III-V compound layers provide a weak bond between the Group III-V compound layers through van der Waals force, and thus a plane on which the additive elements are positioned forms a cleavage plane that is easily cleaved along the plane.

Accordingly, the layered compound according to an embodiment of the invention may be easily peeled off into the Group III-V compound layers along the cleavage plane through either or both physical or chemical methods, and the peeling is more easily achieved with an increasing amount of the additive elements removed. Therefore, a Group III-V compound nanosheet may be easily prepared from the layered compound, and in this case, the additive elements partially remain in the Group III-V compound nanosheet.

With the continuous removal of the additive elements, the interlayer distance between the Group III-V compound layers gradually becomes greater, and eventually the bond between the layers breaks down, which may cause cracks between the layers. Therefore, the layered structure of the layered compound described in an embodiment of the invention includes a case where repeating two-dimensional Group III-V compound layers are interlayer-bonded through van der Waals bonds by additive elements as well as a case where the interlayer bonding force of the Group III-V compound is completely or partially removed to increase the interlayer distance, thereby causing cracks.

In addition, the two-dimensional Group III-V compound layers may exhibit a two-dimensional bonding structure before the removal of additive elements, but when the additive elements are removed greater than a certain level, the bonding structure may change in the Group III-V compound layers, and the structure change may include a change from a two-dimensional bonding structure before the removal to a three-dimensional bonding structure, for example, a zinc blende structure or a wurtzite structure. However, even in this case, since the compound layers keep the two-dimensional shape, except the change in the crystal structure in the layers, the compound layers still exhibit the layered structure due to the structure that the interlayer bonding keeps the van der Waals bonds by additive elements.

Therefore, in an embodiment of the invention, the layered structure includes a case where the Group III-V compound layers form two-dimensional bonds in respective layers and form interlayer-bonds through van der Waals bond by additive elements as well as a case where cracks are formed between the layers with the removal of additive elements, and further includes a case where the Group III-V compound layers are three-dimensionally bonded, but these layers keep a two-dimensional shape, and the bond between these layers is a van der Waals bond by additive elements rather than a bond between Group III-V compounds or the bonding force is completely or partially removed, thereby forming cracks.

A conceptual view for examples of the layered compound and a nanosheet prepared therefrom is shown in FIG. 1. First, a layered Group III-V compound is synthesized using additive elements. In this case, the layered Group III-V compound, which is a Group III-V compound, keeps a layered structure through additive elements 11, the additive elements 11 which are Group I or Group II elements, are positioned between $A_yB_z$ layers 10 which are Group III-V compounds, to keep the bonding between the layers 10 through the van der Waals bonds, and when the additive elements 11 are removed, the bonding force between the $A_yB_z$ layers 10 in $M_{x-m}A_yB_z$ decreases or the interlayer distance increases, thereby forming cracks, and accordingly, in the end, a $M_{x-m}A_yB_z$ nanosheet 20 is prepared by being peeled off from the layered compound.

The nanosheet 20 prepared when peeled off from the layered compound is formed of a plurality of $A_yB_z$ layers of two or more overlapping each other, and may thus be several hundreds of nm thick. In general, nanosheets may exhibit anisotropy according to a two-dimensional shape only when a thickness to a lateral width is less than a certain level. To this end, the ratio of a thickness (d) to a width (L) of a nanosheet (d/L) is preferably 0.1 or less. A width of the nanosheet prepared through an embodiment of the invention may be 5 µm or more, and thus, a thickness of the nanosheet is preferably 500 nm or less.

As described above, the nanosheet according to an embodiment of the invention is a sheet peeled off from the layered compound, which includes two or more two-dimensional Group III-V compound layers, and includes a case where the Group III-V compound layers are bonded through van der Waals bonds by additive elements. In this case, the two-dimensional Group III-V compound layers may have a two-dimensional bonding structure or a three-dimensional bonding structure.

The peeling method may be physical or chemical peeling, and a generally known peeling method using a tape may be used. In addition, to enable easier peeling, the peeling may be performed through irradiation with ultrasonic waves in a liquid state or using a tape after chemical treatment in an acid or base solution.

The additive elements may be Li, Na, K, Rb, Cs, and Fr, which are Group I elements, and Be, Mg, Ca, Sr, Ba, and Ra, which are Group II elements. In particular, Na and K, which are Group I elements, and Ca, which is a Group II element, may be advantageous as additive elements to synthesize layered compounds.

Group III-V compounds forming $A_yB_z$ layers include, for example, GaN, a nitride that may be used in various electrical devices, GaAs and InAs of arsenide series, AlSb, GaSb, InSb of antimony series, InP and GaP of phosphide series, etc., and an embodiment of the invention is not necessarily limited to the exemplified compounds.

Residual additive elements may satisfy $0<m<x$, preferably $0.1x \le m \le 0.9x$, and more preferably $0.25x \le m \le 0.75x$, according to Formula 1 described above. In preparing a Group III-V compound having a layered structure, it is preferable that additive elements to prepare a layered structure are completely removed. However, in the compound according to an embodiment of the invention, the additive elements to form a layered structure are not completely removed as the composition range described above and controlled such that a certain amount of the additive elements remains, so that new electrical properties such as ferroelectric-like properties are implemented in the Group III-V compound having a layered structure.

In the $M_{x-m}A_yB_z$ of Formula 1 above, x, y, and z refer to positive numbers where M, A, and B elements have charge balance according to stoichiometric ratios. In this case, as m is greater than 0 and smaller than x, vacancy is created in the place of additive elements M.

When the vacancy is created, the additive elements M positioned between the $A_yB_z$ layers may move between the layers by an external magnetic field or electric field, and accordingly, the layered compound may exhibit ferroelectric-like properties.

In general, ferroelectric properties are found in oxides of an asymmetric structure such as $BaTiO_3$ having a perovskite structure. In the oxides of an asymmetric structure such as $BaTiO_3$, ferroelectric properties are shown according to changes in the position of Ba located in the center.

In contrast, the layered compound and the nanosheet according to an embodiment of the invention exhibit ferroelectric-like properties due to the movement of additive elements between the layers, despite having a polar-symmetry structure instead of the asymmetric structure.

In this stable $M_xA_yB_z$, as the partial removal of the additive elements M comes with ferroelectric-like properties, m has to be greater than 0, and smaller than x to make sure that at least some of the additive elements remain.

Meanwhile, when m is removed by a too small amount, the movement between the layers may not be easy, and thus, m is 0.1x or greater, and when m is removed too much, the layered structure may break down or there may be no additive elements required for the movement, thereby failing to obtain ferroelectric properties, and thus, m is preferably 0.9x or less, and more preferably 0.25x to 0.75x.

As such, the layered compound or nanosheet according to an embodiment of the invention may exhibit ferroelectric properties while having a polar-symmetry structure, and the crystal structure and properties may thus be applied to various electrical devices.

In addition, the layered compound and the nanosheet according to an embodiment of the invention may exhibit resistance switching properties.

When a material has resistance switching properties, current does not increase linearly according to voltages applied to the material, but when an initial voltage is applied, the material keeps a high resistance state to have an insignificant increase in the current and then when the material reaches a certain critical point, the material switches to a low resistance state to have a sharp increase in the current.

These resistance switching properties are generally found in oxides, and recently, using the properties, memory devices such as a memristor capable of storing information like a flash memory have been actively developed.

When preparing a Group III-V compound according to an embodiment of the invention or a nanosheet formed of the compound, first, M as an additive element is added to synthesize a layered compound having a composition of $M_xA_yB_z$, and then M as an additive element is partially removed using an acid, and a layered compound having a composition of $M_{x-m}A_yB_z$ may thus be prepared.

As such, when the additive elements are removed through the strong acid, the place where the additive elements are partially removed is replaced with hydrogen ions contained in the strong acid, and as shown in Formula 2, a layered compound containing hydrogen and a nanosheet formed of the compound may be prepared.

$$M_{x-m}H_nA_yB_z \quad \text{[Formula 2]}$$

(Where M is at least one of Group I or Group II elements, A is at least one of Group III elements, B is at least one of Group V elements, x, y, and z are positive numbers which are determined according to stoichiometric ratios to ensure charge balance when m is 0, and $0<m<x$, and $0<n\le m$).

As described above, the range of m may be preferably equal to or more than 0.1x and equal to or less than 0.9x, and more preferably equal to or more than 0.25x and equal to or less than 0.75x.

As such, the layered compound containing hydrogen and the nanosheet may have ferroelectric-like properties despite having a polar-symmetry structure as described above, and have resistance switching properties as well to be applied to various electrical devices, and in particular, to become applicable to memory devices such as memristors.

Example 1

1) Synthesis of $Na_2Ga_2As_3$ Having a Layered Structure

Na, Ga, and As were weighed at a molar ratio of 7.8:3.4:7.5, mixed, and then put into an alumina crucible. Next, the mixture was placed in a quartz tube which was then double-sealed to block outside air. The process was performed in a glove box under argon atmosphere. Thereafter, the resultant was put at a temperature raised to 750° C. in a box furnace, kept for 40 hours, and cooled to room temperature for 300 hours to obtain a sample of $Na_2Ga_2As_3$.

2) Removal of Na

Na was partially removed from $Na_2Ga_2As_3$ through reaction in a saturated $GaCl_3$ solution for 6 hours to 24 hours. The results are shown in Table 1 below. Residual Na in Table 1 shows the results obtained through EDS analysis.

TABLE 1

| Name of sample | Reaction time | Residual Na (at %) |
|---|---|---|
| Sample A | — | 28.5 |
| Sample B | 6 hours | 14.0 |
| Sample C | 12 hours | 7.7 |
| Sample D | 24 hours | 4.8 |

3) Process of Preparing Nanosheets

The samples prepared as in Table 1 were irradiated with ultrasonic waves in ethanol to prepare nanosheets peeled off therefrom using a tape.

Example 2

1) Synthesis of a Layered Structure $K_2In_2As_3$

K, In, and As were weighed, mixed, and then put into an alumina crucible. Next, the mixture was placed in a quartz tube which was then double-sealed to block outside air. The process was performed in a glove box under argon atmosphere. Next, the resultant was put at a temperature raised to 850° C. in a box furnace and kept for 12 hours. Thereafter, for recrystallization and crystal growth, the resultant was cooled to 500° C. at a temperature reduction rate of 5° C./h, and then kept for 100 hours at 500° C. and cooled to room temperature to obtain a sample of $K_2In_2As_3$ having a monoclinic crystal structure of a space group of $P2_1/c$.

2) Removal of K

The layered $K_2In_2As_3$ was subjected to reaction over time in a 0.25 M HCl solution diluted with ethanol to remove K therefrom. The results are shown in the table below. Residual K in Table 2 shows the results obtained through EDS analysis.

TABLE 2

| Name of sample | Removal of additive elements | Reaction time | Residual K (at %) |
|---|---|---|---|
| Sample A | — | — | 28 |
| Sample B | Hydrochloric acid | 1 hour | 22 |
| Sample C | Hydrochloric acid | 2 hours | 12.3 |
| Sample D | Hydrochloric acid | 3.5 hours | 5.95 |
| Sample E | Hydrochloric acid | 8 hours | 1.2 |

3) Process of Preparing Nanosheets

The samples prepared as in Table 2 above were irradiated with ultrasonic waves in ethanol to prepare nanosheets peeled off therefrom using a tape.

Example 3

1) Synthesis of $Na_2Al_2Sb_3$ Having a Layered Structure

Metal pieces of Na, Al, and Sb were weighed according to the molar ratio, mixed, and then put into an alumina crucible, placed in a quartz tube, and double-sealed to block external air. The process was performed in a glove box under argon atmosphere. Next, the resultant was put at a temperature raised to 750° C. for three hours in a box furnace and kept for 40 hours. Thereafter, for recrystallization and crystal growth, the resultant was slowly cooled to room temperature for 200 hours to obtain a sample of $Na_2Al_2Sb_3$.

2) Removal of Na $AlCl_3$ was dissolved in acetonitrile to a concentration of 0.05 M and 2 ml of ethanol-based HCl was added thereto to prepare a solution, and then the solution was subjected to reaction over time to remove Na from the layered $Na_2Al_2Sb_3$. The results are shown in the table below. Residual Na in Table 3 shows the results obtained through EDS analysis.

TABLE 3

| Name of sample | Reaction time | Residual Na (at %) |
|---|---|---|
| Sample A | — | 28.5 |
| Sample B | 0.5 hours | 13.9 |
| Sample C | 2 hours | 8.8 |
| Sample D | 4 hours | 4.1 |
| Sample E | 12 hours | 0.25 |

3) Process of Preparing Nanosheets

The samples prepared as in Table 3 above were irradiated with ultrasonic waves in ethanol to prepare nanosheets peeled off therefrom using a tape.

Example 4

1) Synthesis of $KGaSb_2$ Having a Layered Structure

Metal pieces of K, Ga, and Sb were weighed according to the molar ratio, mixed, and then put into an alumina crucible. Next, the mixture was placed in a quartz tube which was then double-sealed to block outside air. The process was performed in a glove box under argon atmosphere. Next, the resultant was put at a temperature raised to 750° C. for three hours in a box furnace and kept for 15 hours. Thereafter, for recrystallization and crystal growth, the resultant was slowly cooled at 500° C. for 100 hours, kept for 100 hours, and cooled to room temperature to obtain a final sample of $KGaSb_2$.

2) Removal of K $GaCl_3$ was dissolved in acetonitrile and 2 ml of ethanol-based HCl was added thereto to prepare a solution, and then the solution was subjected to reaction over time to remove K from the layered $KGaSb_2$. The results are shown in the table below. Residual K in Table 4 shows the results obtained through EDS analysis.

TABLE 4

| Name of sample | Reaction time | Residual K (at %) |
|---|---|---|
| Sample A | — | 29.9 |
| Sample B | 0.5 hours | 17.5 |
| Sample C | 2 hours | 15 |
| Sample D | 4 hours | 6.6 |
| Sample E | 8 hours | 4.9 |
| Sample F | 12 hours | 0.29 |

3) Process of Preparing Nanosheets

The samples prepared as in Table 4 above were irradiated with ultrasonic waves in ethanol to prepare nanosheets peeled off therefrom using a tape.

Example 5

1) Synthesis of $K_2In_2Sb_3$ Having a Layered Structure

Metal pieces of K, In, and Sb were weighed according to the molar ratio, mixed, and then put into an alumina crucible. Next, the mixture was placed in a quartz tube which was then double-sealed to block outside air. The process was performed in a glove box under argon atmosphere. Next, the resultant was put at a temperature raised to 750° C. for three hours in a box furnace and kept for 15 hours. Thereafter, for recrystallization and crystal growth, the resultant was cooled to 500° C. at a temperature reduction rate of 5° C./h, and then kept for 100 hours at 500° C. and cooled to room temperature to obtain a sample of $K_2In_2Sb_3$ having a monoclinic crystal structure of a space group of $P2_1/c$.

2) Removal of K $InCl_3$ was dissolved in excess to prepare a 33% HCl solvent, and then the solvent was subjected to reaction over time to remove K from the layered $K_2In_2Sb_3$. The results are shown in the table below. Residual K in Table 5 shows the results obtained through EDS analysis.

TABLE 5

| Name of sample | Removal of additive elements | Reaction time | Residual K (at %) |
|---|---|---|---|
| Sample A | — | — | 25.0 |
| Sample B | Hydrochloric acid | 0.5 hours | 21.0 |
| Sample C | Hydrochloric acid | 2 hours | 10.1 |
| Sample D | Hydrochloric acid | 12 hours | 0.19 |

3) Process of Preparing Nanosheets

The samples prepared as in Table 5 above were irradiated with ultrasonic waves in ethanol to prepare nanosheets peeled off therefrom using a tape.

Example 6

1) Synthesis of $CaGa_2P_2$ Having a Layered Structure

Ga, Ga, and P were weighed at a molar ratio of 1:2:2, placed in an alumina crucible, and additionally 4 times gallium was added thereto to achieve the total molar ratio of 1:10:2. Next, the mixture was placed in a quartz tube which was then double-sealed to block outside air. Thereafter, the added raw materials were heated to 1000° C. to be entirely liquefied and kept at the same temperature for 40 hours. Subsequently, the resultant was subjected to cooling at a rate of 10° C. per hour to room temperature, and the collected sample was washed with a hydrochloric acid solution and deionized water to remove residual P and Ga to synthesize $CaGa_2P_2$.

2) Removal of Ca

Ca ions were removed from the layered $CaGa_2P_2$ through nitric acid.

The amount of Ca removal was controlled at varied concentration of nitric acid and time, and the results are shown in Table 6 below.

TABLE 6

| Name of sample | Removal of additive elements | Reaction time | Residual Ca (at %) |
|---|---|---|---|
| Sample A | — | — | 20.3 |
| Sample B | 30% nitric acid | 12 minutes | 15.5 |
| Sample C | 10% hydrofluoric acid | 30 minutes | 11.4 |
| Sample D | 30% nitric acid | 18 minutes | 6.85 |
| Sample E | 30% nitric acid | 30 minutes | 4.1 |
| Sample F | 30% nitric acid | 60 minutes | 2.6 |
| Sample G | 30% nitric acid | 24 hours | 1.9 |

3) Process of Preparing Nanosheets

The samples prepared as in Table 6 above were irradiated with ultrasonic waves in ethanol to prepare nanosheets peeled off therefrom using a tape.

Example 7

1) Synthesis of $CaIn_2P_2$ Having a Layered Structure

Ca, In, and P were weighed at a molar ratio of 1:2:2, mixed, and then put into an alumina crucible. Next, the mixture was placed in a quartz tube which was then double-sealed to block outside air. The process was performed in a glove box under argon atmosphere. Thereafter, in the box furnace, the temperature was raised to allow all Ca, In, and P to be present as a liquid, which were kept for 20 hours, cooled to 500° C. for 100 hours, and kept again for 100 hours to obtain a sample of $CaIn_2P_2$.

2) Removal of Ca

The sample was subjected to reaction in a 30% nitric acid IPA mixed solution over time to remove Ca from the layered $CaIn_2P_2$. Changes in the elemental ratio of In came along with the removal of Ca, and the results are shown in the table below.

TABLE 7

| Name of sample | Reaction time | Elemental ratio |
|---|---|---|
| Sample A | — | Ca:In:P = 1:2:2 |
| Sample B | 10 minutes | Ca:In:P = 0.4:1.6:2 |

TABLE 7-continued

| Name of sample | Reaction time | Elemental ratio |
|---|---|---|
| Sample C | 20 minutes | Ca:In:P = 0.2:0.6:2 |
| Sample D | 30 minutes | Ca:In:P = 0.17:2.1:2 |

The samples prepared as in Table 7 above were irradiated with ultrasonic waves in ethanol to prepare nanosheets peeled off therefrom using a tape.

Example 8

1) Synthesis of CaGaN Having a Layered Structure

Ga and $Ca_3N_2$ were weighed at a molar ratio of Ga:$Ca_3N_2$=1:4, put into a tungsten tube, sealed, and then placed in a quartz tube to create a vacuum atmosphere at a level of 0.1333 Pa. Thereafter, while nitrogen gas was injected in an amount of 5 L/min, the resultant was put at a temperature raised by 50° C. per hour, heated to 900° C., and kept at the same temperature for 24 hours.

Subsequently, the resultant was subjected to cooling at a rate of 0.1° C. per hour to room temperature, and the collected sample was washed with a HCl solution and deionized water to remove residual $Ca_3N_2$ and separate black crystal therefrom to synthesize a final compound of CaGaN. All processes described above were performed in a glove box under argon atmosphere.

2) Removal of Ca Ions

Removal using nitric acid: 15 ml (3.5 M) of nitric acid was mixed with 0.1 g of CaGaN and the mixture was subjected to reaction at room temperature and pressure. The reaction time was varied to 10 minutes, 15 minutes, 20 minutes, 30 minutes, and 60 minutes to prepare samples. After the reaction in nitric acid, the resultant was additionally washed with deionized water to remove the formed $Ca(NO_3)_2$.

Removal using iodine: iodine and acetonitrile solvents were mixed to prepare a 12 ml (0.025 M) solution, which was then subjected to reaction with 0.1 g of CaGaN powder at room temperature and pressure for 24 hours. After the reaction was complete, the resultant was washed with an acetonitrile solvent to remove the formed $CaI_2$ salt.

Accordingly, the samples from which additive elements were removed through nitric acid and iodine were obtained as shown in the table below. Sample G was the layered CaGaN without a process of Ca removal.

TABLE 8

| Name of sample | Removal of additive elements | Reaction time | Residual Ca (at %) |
|---|---|---|---|
| Sample A | — | — | (Before removal of Ca) |
| Sample B | Nitric acid | 10 minutes | 23.3 |
| Sample C | Nitric acid | 15 minutes | (Not measured) |
| Sample D | Nitric acid | 20 minutes | 15.6 |
| Sample E | Nitric acid | 30 minutes | 11.4 |
| Sample F | Nitric acid | 60 minutes | 6.8 |
| Sample G | Iodine | 24 hours | 9.5 |

3) Process of Preparing Nanosheets

Nanosheets were prepared through a tape peeling method for the samples prepared as shown in Table 8 above.

Results of analyzing the samples prepared according to Examples 1 to 8 will be described below.

FIGS. 2A to 3A show results of analyzing the samples prepared according to Example 1 of the invention.

Figure 2A:
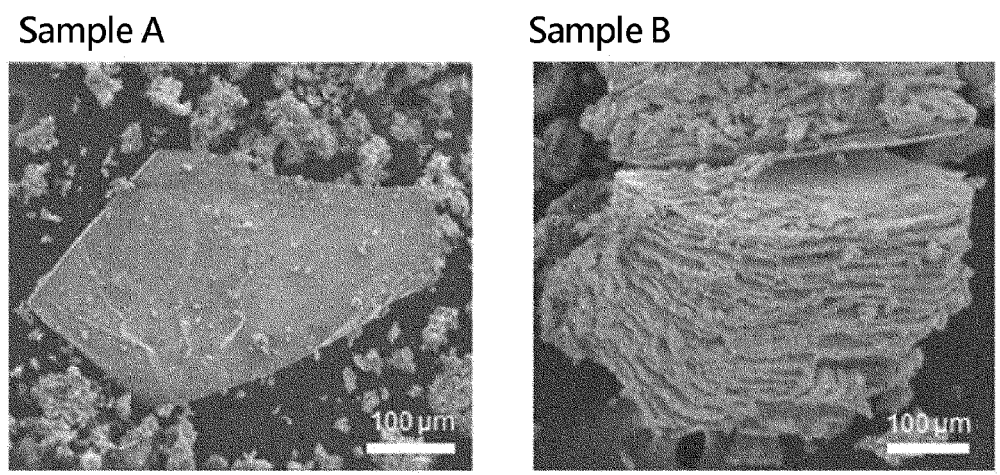
FIG. 2A to 2D are results of analyzing samples according to Example 1 of the invention.

FIG. 2A is a scanning electron microscopy image of Sample A and Sample B of Example 1, and it was found that interlayer cracks were formed after the removal of the additive elements from acid. Accordingly, easier peeling was enabled to prepare nanosheets.

Figure 2B:
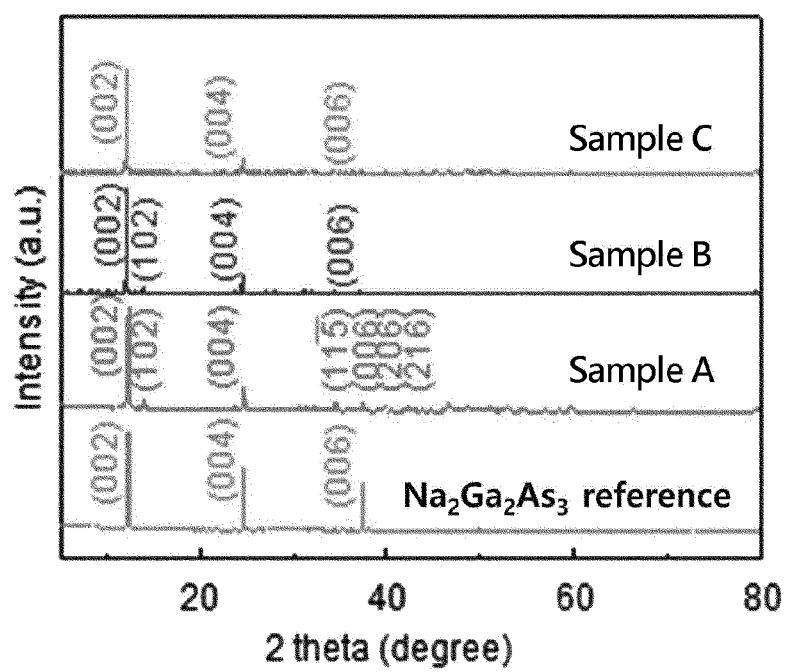

FIG. 2B shows XRD data of the layered $Na_2Ga_2As_3$ and Samples A to C in Example 1 of the invention. In Samples B and C from which Na was partially removed, main peaks such as (002), (102), (004), and (006) remained, indicating that the space group of $P2_1$/c, which is a layered structure of parent structure $Na_2Ga_2As_3$ was kept.

Figure 2C:
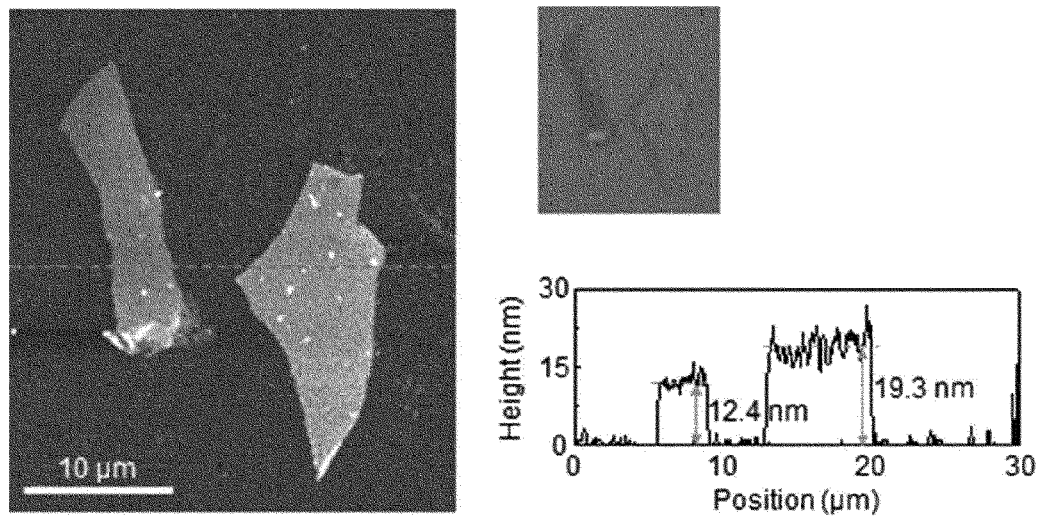

FIG. 2C shows an atomic force microscopy (AFM) image of a nanosheet peeled off from Sample B of Example 1 and a line-profile therefrom. It was confirmed that the sample was peeled off into a nanosheet having a thickness of 20 nm or less.

Figure 2D:
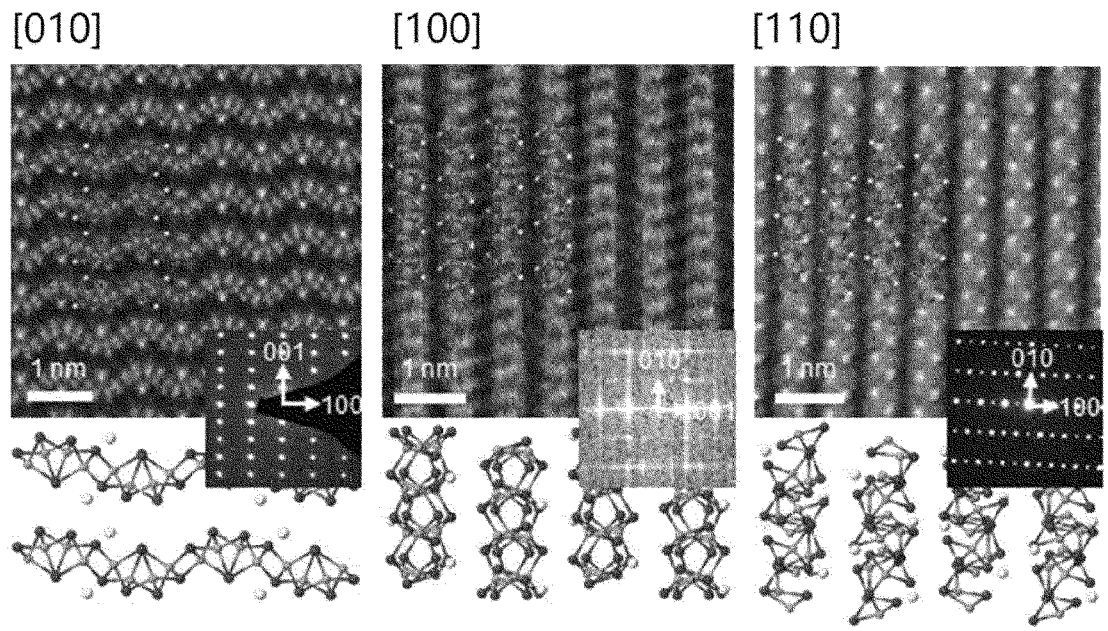

FIG. 2D is a scanning transmission electron microscopy (STEM) image and an electron diffraction (ED) pattern for a cross section in [010], [100], and [110] directions for Sample B of Example 1, and it was found that change to a different structure or amorphization was not caused after Na was partially removed when compared to before the removal of Na to allow the layered structure to be kept.

Figure 3A:
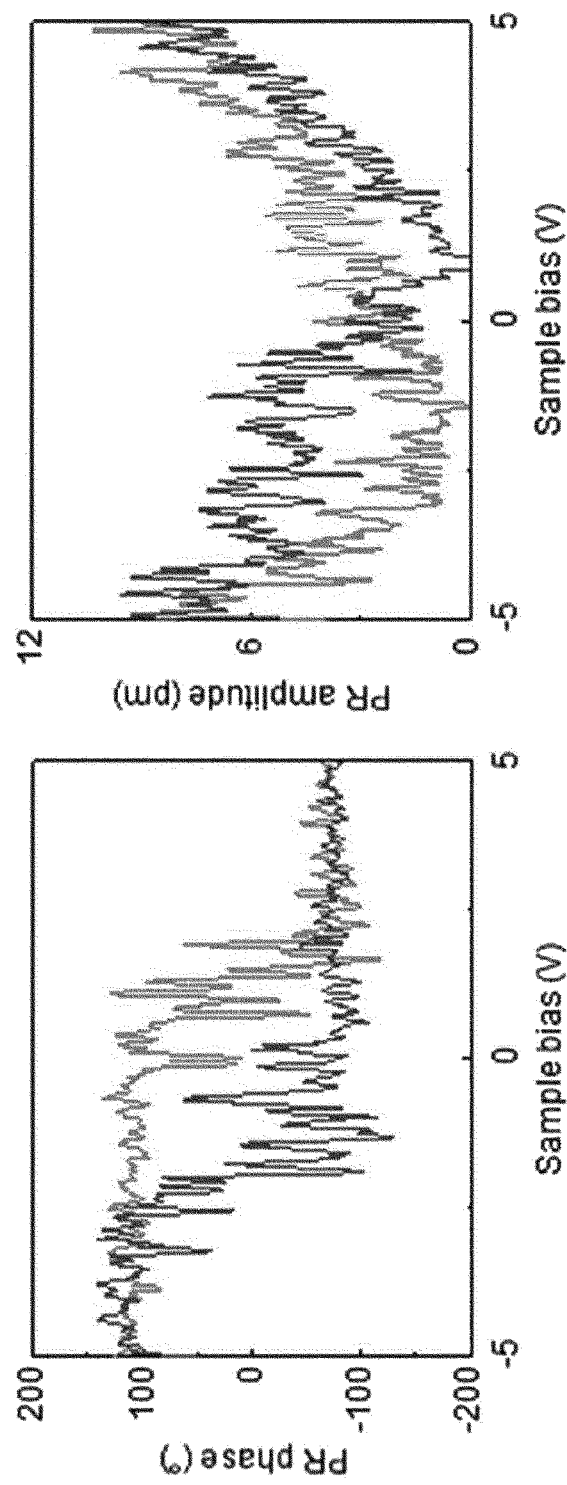
FIGS. 3A and 3B are results of analyzing electrical properties of samples according to Example 1 of the invention.

In FIG. 3A, ferroelectric properties were measured through piezoresponse force microscopy (PFM) for the nanosheet peeled off from Sample B, and the measurement results showed a hysteresis loop. From the results, it was confirmed that the compound prepared according to Example 1 had ferroelectric-like properties.

Figure 3B:
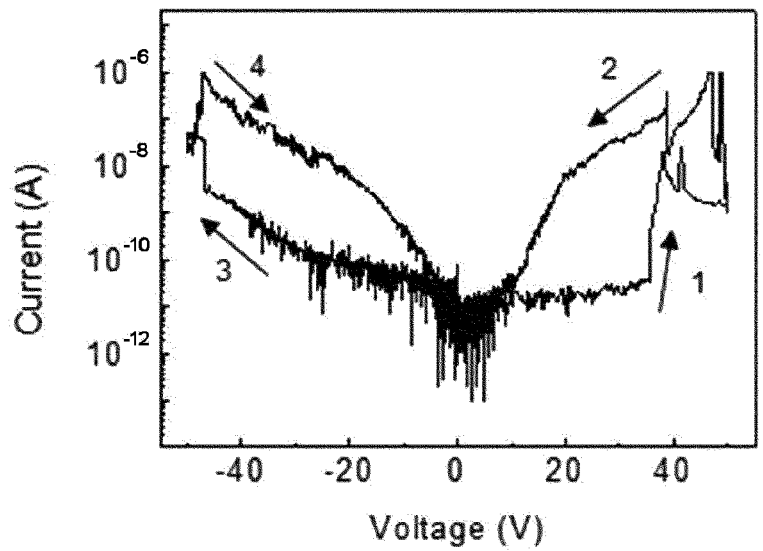

In addition, current changes according to voltages were measured for the nanosheet peeled off from Sample B, and results are shown in FIG. 3B. It was found that at an initial voltage, the nanosheet kept a high resistance state 1, indicating a low current flow, but when the voltage was greater than a certain level, the nanosheet switched to a low resistance state 2, indicating a sharp increase in the current, and the same properties were shown in an opposite electrode direction. From the results, it was confirmed that the compound prepared according to Example 1 of the invention exhibited resistance switching properties.

FIGS. 4A to 5B show results of analyzing the samples prepared according to Example 2 of the invention.

Figure 4A:
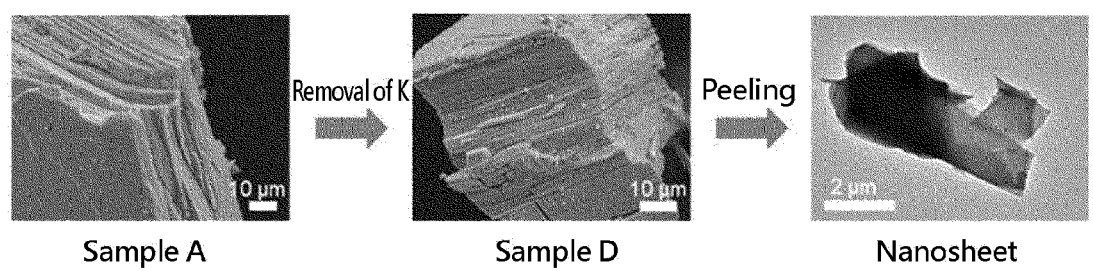
FIG. 4A to 4D are results of analyzing samples according to Example 2 of the invention.

FIG. 4A shows a nanosheet prepared after the removal of K from Sample A of Example 2 to become Sample D, and being peeled off from Sample D using a tape. In Sample A, a cleavage plane between the layers was observed, but in Sample D, with the removal of K, the interlayer distance increased to form cracks in some sections.

Figure 4B:
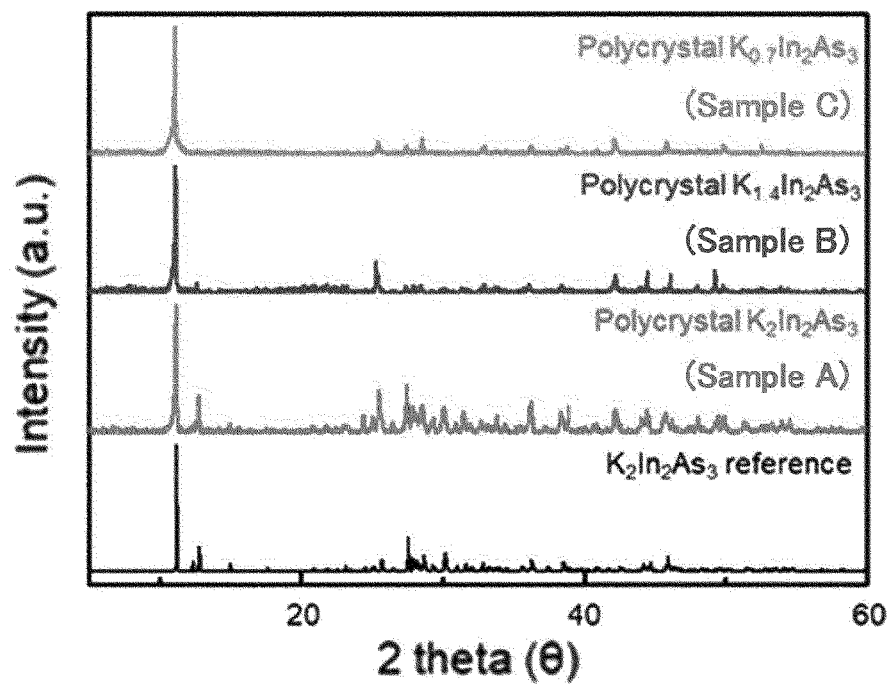

FIG. 4B shows XRD peaks and changes thereof for samples before and after the removal of K in Example 2. It was found that the peaks of the (002) plane and (022) plane were shown at 11.2°±0.50° and 27.5°±0.50°, respectively, equally in Sample A before the removal of K, and Sample B and Sample C after the partial removal of K. Therefore, it was found that the space group of $P2_1$/c, which is a layered structure, was kept both before and after the removal of K.

Figure 4C:
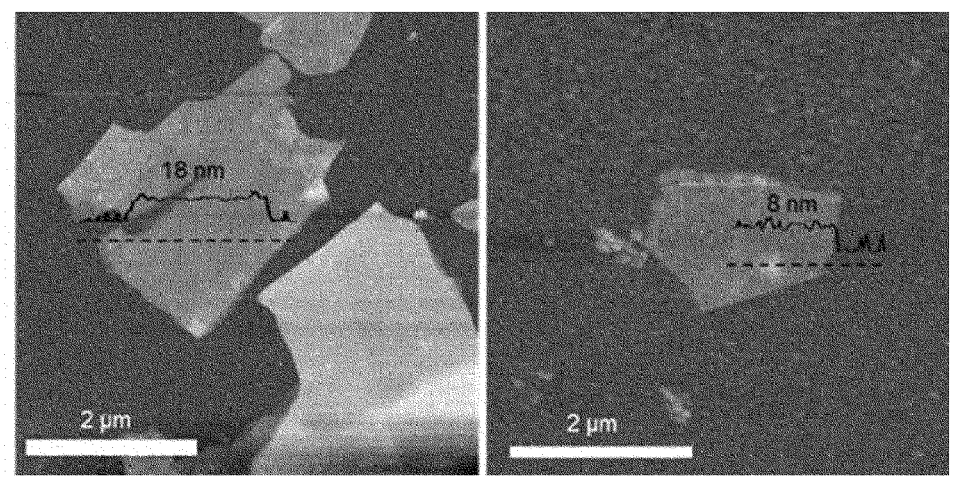

FIG. 4C shows an AFM image of a nanosheet prepared by being peeled off from Sample D in Example 2 and a line profile therefrom. It was confirmed that the sample D was peeled off into a nanosheet having a thickness of 8 nm to 18 nm.

Figure 4D:
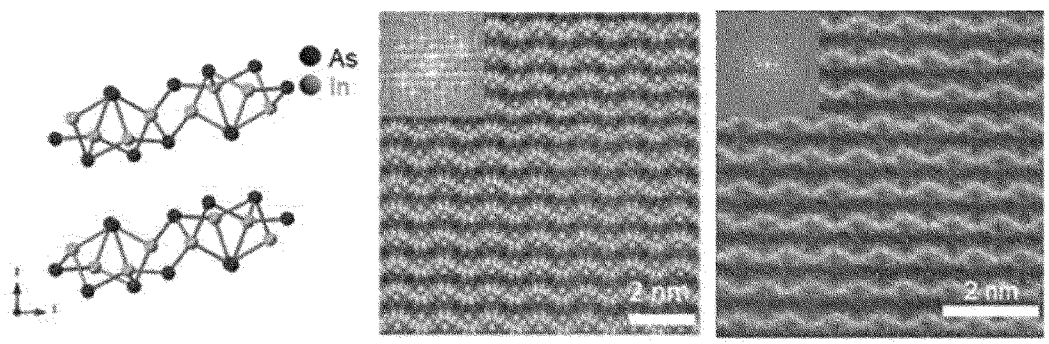

FIG. 4D shows results of STEM measurement for Sample C in Example 2, and it was found that the crystal structure was kept even after the removal of K.

Figure 5A:
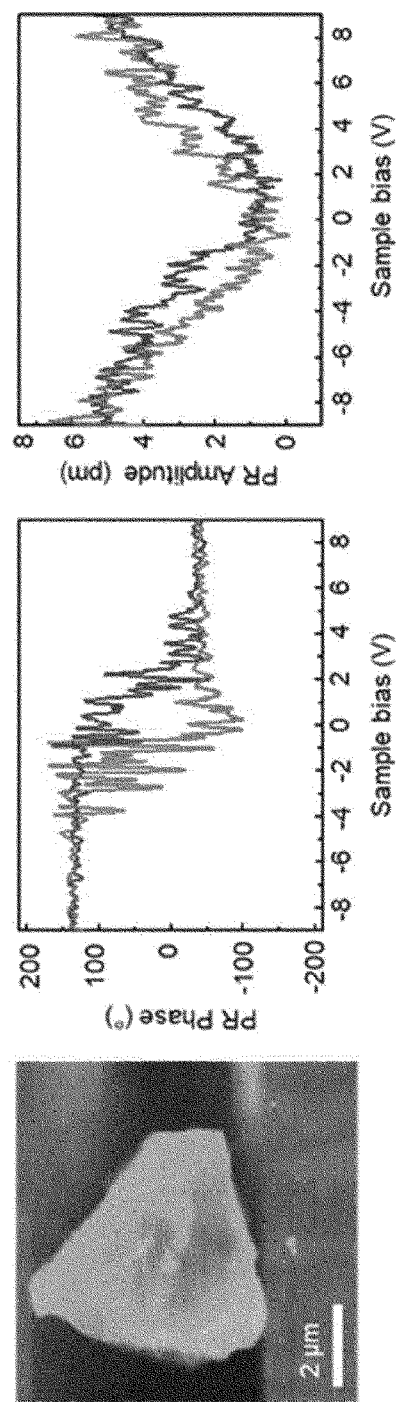
FIGS. 5A and 5B are results of analyzing electrical properties of samples according to Example 2 of the invention.

FIG. 5A shows ferroelectric properties measured through PFM for the nanosheet peeled off from Sample C of Example 2, and the measurement results show a hysteresis loop. From the results, it was confirmed that the compound prepared according to Example 2 had ferroelectric-like properties.

Figure 5B:
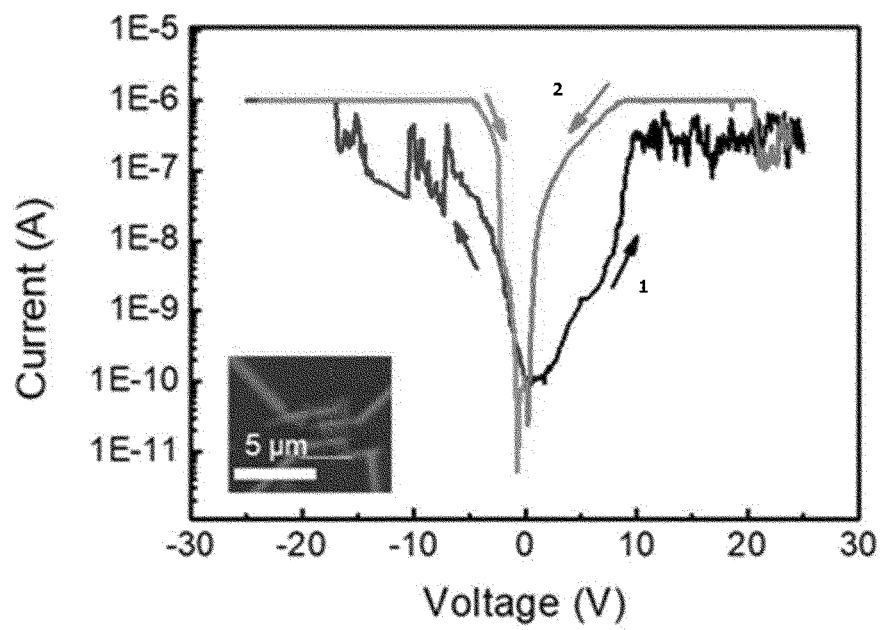

In addition, in FIG. 5B, current changes according to voltages were measured for the nanosheet peeled off from Sample C, and results are shown. It was found that at an initial voltage, the nanosheet kept a high resistance state 1, indicating a low current flow, but when the voltage was greater than a certain level, the nanosheet switched to a low resistance state 2, indicating a sharp increase in the current, and the same properties were shown in an opposite electrode direction, thereby exhibiting resistance switching properties.

FIGS. 6A to 7B show results of analyzing the samples prepared according to Example 3.

Figure 6A:
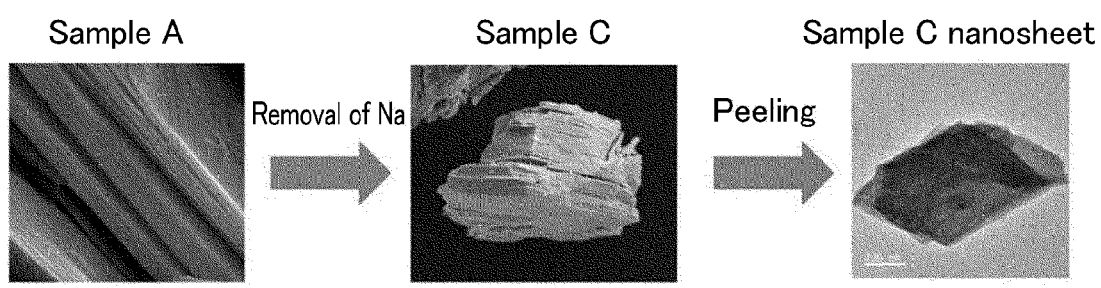
FIG. 6A to 6C are results of analyzing samples according to Example 3 of the invention.

FIG. 6A shows a nanosheet prepared after the removal of Na from Sample A of Example 3 to become Sample C, and being peeled off from Sample D using a tape. In Sample A, a cleavage plane between the layers was observed, but in Sample C, with the removal of Na, the interlayer distance increased, thereby forming cracks.

Figure 6B:
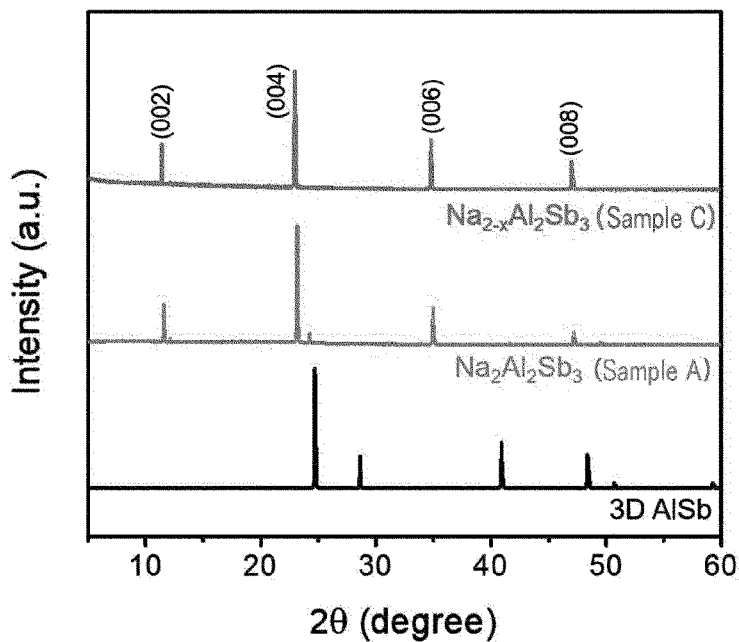

FIG. 6B shows diffraction peaks (3D AlSb) of a non-layered AlSb having a general zinc blende structure, diffraction peaks of Sample A of Example 3 (Sample A), and diffraction peaks of Sample C from which Na was partially removed (Sample C). The XRD diffraction pattern of Sample C showed main peaks in the same angular range according to the removal of Na when compared to Sample A, indicating that the monoclinic crystal structure of Sample A, which is P2$_1$/c, was still kept.

Figure 6C:
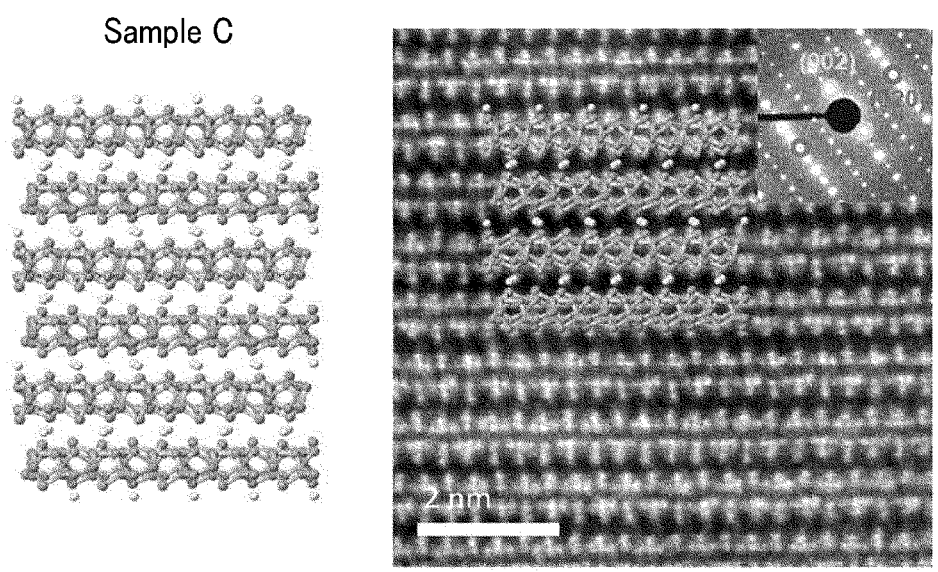

FIG. 6C is a schematic view of a layered Na$_{2-x}$Al$_2$Sb$_3$ atomic structure after selectively removing Na, and a STEM image in a [010] direction for Sample B, and a selected area electron diffraction (SAED) pattern image. Results of SAED analysis showed that the interplanar distance of a (002) diffraction pattern was 7.79 Å, and the interplanar distance of a (020) diffraction pattern was 3.63 Å. Compared to the interplanar distance between a theoretical (002) plane and the (020) plane of 7.776 Å and 3.61 Å, respectively, the measured values were considered to be consistent with the theoretical values. These measurement values are not expected to be found in the non-layered AlSb having a zinc blende structure. In addition, given that the Na ratio of the parent structure Na$_2$Al$_2$Sb$_3$ is 28.5% but the Na ratio of the measured Na$_{2-x}$Al$_2$Sb is 13.9%, it was confirmed that Na was partially removed. Further, the measured pattern is a pattern that is only found in the space group of P2$_1$/c. In the SAED pattern, a zone-axis may be obtained through an outer product from a plane measured by patterns, and a vector obtained through an outer product of the (002) and (020) plane is [100]. Therefore, it was confirmed that the zone-axis was found to be [100], and the lattice structure in the actually measured STEM image observed from the zone and the shape of the theoretically obtained atomic structure model were exactly identical. From the results, it was confirmed that the material from which Na was removed also kept the P2$_1$/c space group of the parent material Na$_2$Al$_2$Sb$_3$.

Figure 7A:
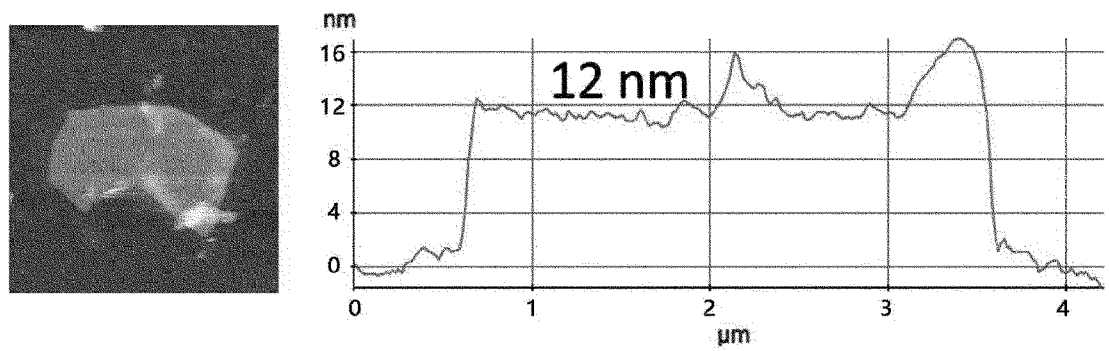
FIGS. 7A and 7B are results of analyzing electrical properties of samples according to Example 3 of the invention.

FIG. 7A shows an AFM image of a nanosheet prepared by being peeled off from Sample C in Example 3 and a line profile therefrom. It was confirmed that a nanosheet was peeled off to have a thickness of 20 nm or less.

Figure 7B:
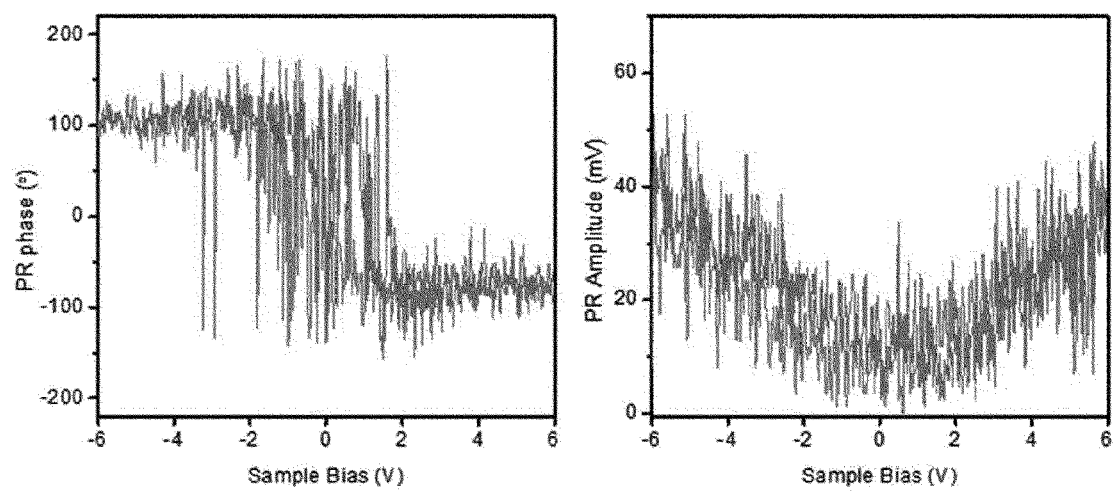

In addition, after preparing a nanosheet for Sample C from which Na was removed, ferroelectric-like properties were measured through PFM, and results are shown in FIG. 7B. From the results, it was observed that the ferroelectric-like properties were present.

FIGS. 8A TO 9B show results of analyzing samples prepared according to Example 4.

Figure 8A:
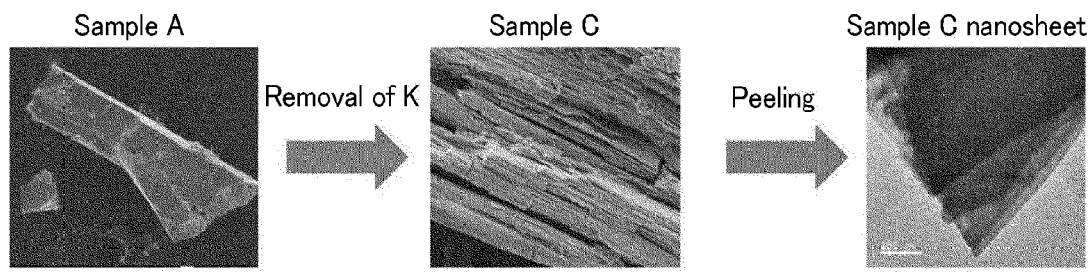
FIG. 8A to 8C are results of analyzing samples according to Example 4 of the invention.

FIG. 8A shows a nanosheet prepared after the removal of K from Sample A of Example 4 to become Sample C, and being peeled off from Sample D using a tape. In Sample A, a cleavage plane between the layers was observed, but in Sample C, with the removal of K, the interlayer distance increased, thereby forming cracks.

Figure 8B:
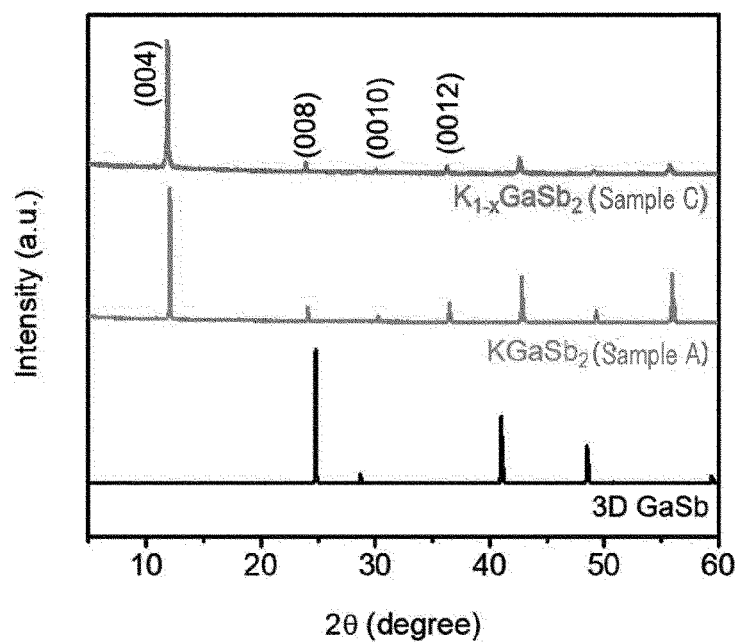

FIG. 8B shows diffraction peaks (3D GaSb) of a non-layered GaSb having a general zinc blende structure, diffraction peaks of Sample A, and diffraction peaks of Sample C from which K was partially removed. The XRD diffraction pattern of Sample C showed main peaks in the same angular range according to the removal of K when compared to Sample A, indicating that Cmca of Sample A, an orthorhombic crystal structure, was still kept.

Figure 8C:
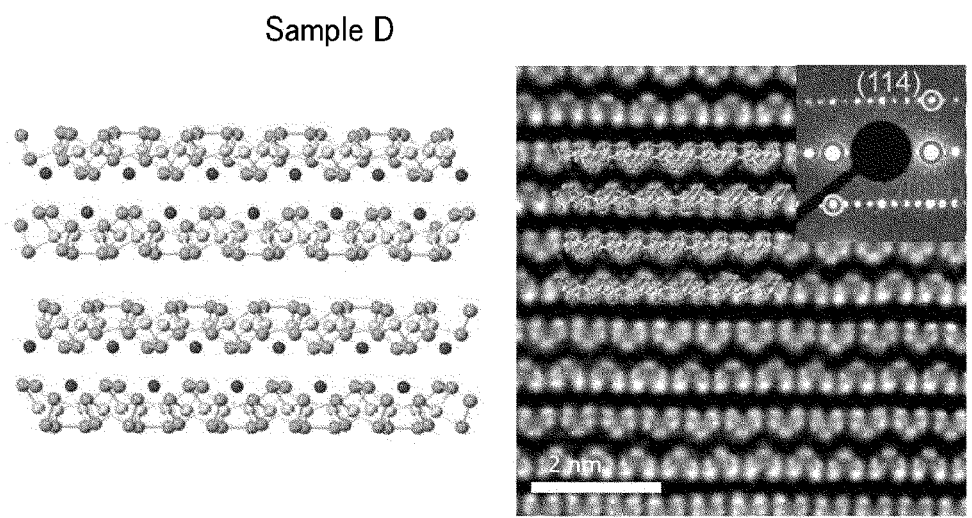

FIG. 8C is a schematic view of a layered K$_{1-x}$GaSb$_2$ atomic structure after selectively removing K, and a STEM image in a [010] direction for Sample D, and a SAED pattern image. The atomic ratio of residual K ions was 6.59 at %. Results of SAED analysis showed that the interplanar distance of a (004) diffraction pattern was 7.465 Å, and the interplanar distance of a (114) diffraction pattern was 5.07 Å. Compared to the interplanar distance between the theoretical (004) plane and the (114) plane of 7.408 Å and 5.10 Å, respectively, the measured values were considered to be consistent with the theoretical values. These measurement values are not expected to be found in the non-layered zinc blende GaSb. In addition, given that the K ratio of the parent structure KGaSb$_2$ is 25 at % but the Na ratio of the measured K$_{1-x}$GaSb$_2$ is 6.59 at %, it was confirmed that K was partially removed, and the measured pattern was a pattern that is only found in the Cmca space group. In the SAED pattern, a zone-axis may be obtained through an outer product from a plane measured by patterns, and a vector obtained through an outer product of the (004) and (114) planes is [1−10]. Therefore, it was confirmed that the zone-axis was found to be [1−10], and the lattice structure in the actually measured STEM image observed from the [1−10] zone and the shape of the theoretically obtained atomic structure model were exactly identical. Accordingly, it was confirmed that the material from which K was removed as well still kept the Cmca space group of the parent material KGaSb$_2$.

Figure 9A:
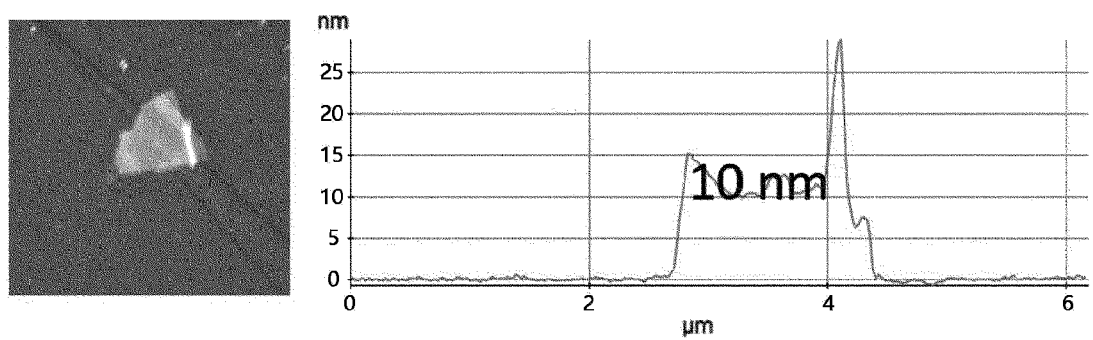
FIGS. 9A and 9B are results of analyzing electrical properties of samples according to Example 4 of the invention.

FIG. 9A shows an AFM image of a nanosheet prepared by being peeled off from Sample C in Example 4 and a line profile therefrom. It was confirmed that a nanosheet was peeled off to have a thickness of 10 nm.

Figure 9B:
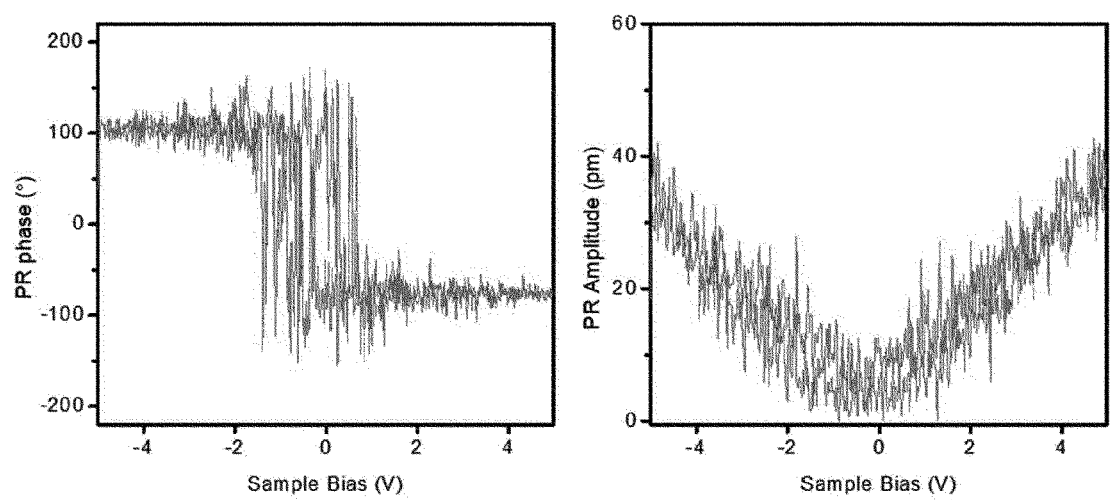

In addition, in FIG. 9B, after preparing a nanosheet for Sample C from which K was removed, ferroelectric-like properties were measured through PFM, and results are shown. From the results, it was observed that the ferroelectric-like properties were present. It was found that using these ferroelectric-like properties, it may be possible to apply to various electric elements, and to a memristor device, which has been actively developed as a neuromorphic memory device in recent years.

FIGS. 10A TO 11B show results of analyzing samples prepared according to Example 5.

Figure 10A:
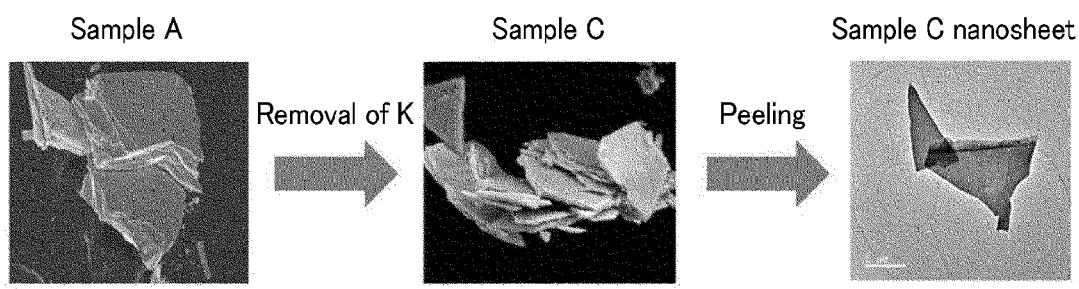
FIG. 10A to 10C are results of analyzing samples according to Example 5 of the invention.

FIG. 10A shows a nanosheet prepared after the removal of K from Sample A of Example to become Sample C, and being peeled off from Sample D using a tape. In Sample A, a cleavage plane between the layers was observed, but in Sample C, with the removal of Na, the interlayer distance increased, thereby forming cracks.

Figure 10B:
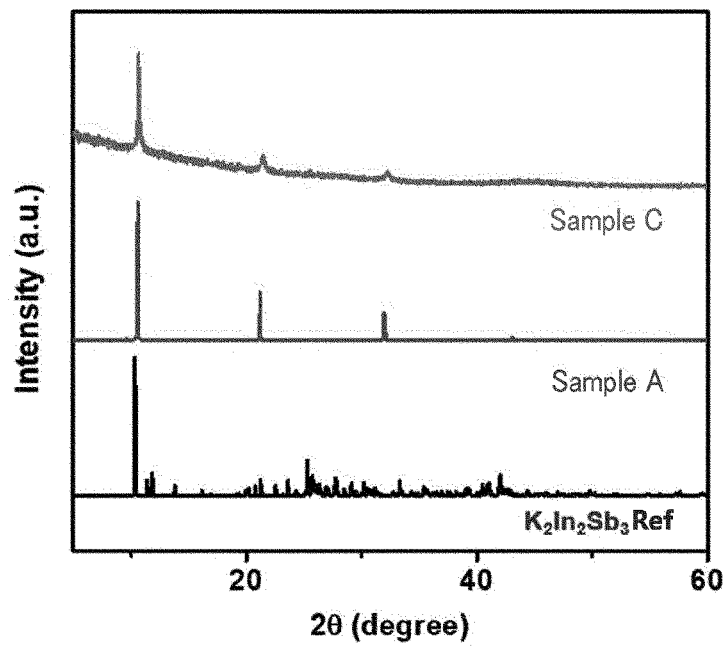

FIG. 10B is a graph showing XRD results of the reference peak ($K_2In_2Sb_3$ Ref) of a single crystal of $K_2In_2Sb_3$, Sample A of Example 5, and Sample C in which K was partially removed from Sample A. The XRD diffraction pattern of Sample C, though slightly lower in crystallinity, showed main peaks in the same angular range according to the removal of K when compared to Sample A, indicating that the monoclinic crystal structure, which is $P2_1/c$ of Sample A, was still kept.

Figure 10C:
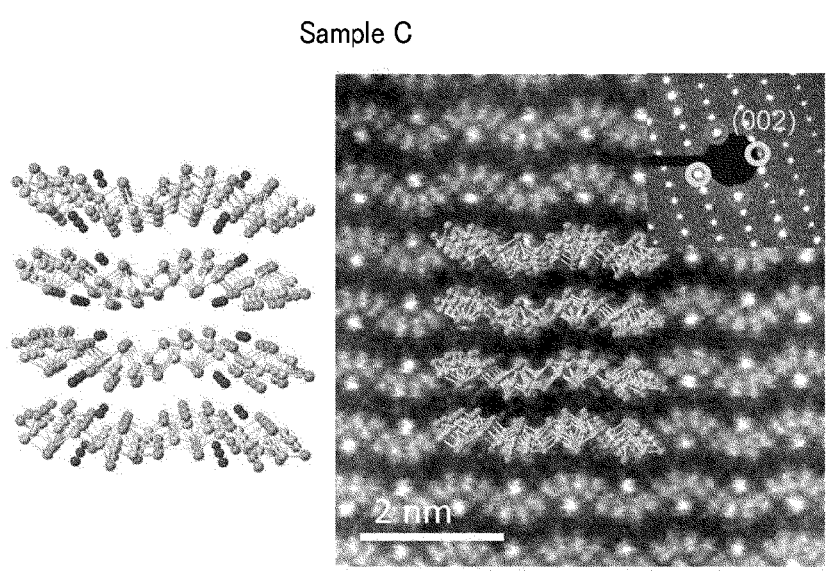

FIG. 10C is a schematic view of a layered $K_{2-x}In_2Sb_3$ atomic structure after selectively removing K in Example 5, and a STEM image in a [010] direction for Sample C, and a SAED pattern image. Results of SAED analysis showed that the interplanar distance of a (002) diffraction pattern was 8.3 Å, and the interplanar distance of a (200) diffraction pattern was 7.64 Å. Compared to the interplanar distance between theoretical (200) and (002) planes of 7.6437 Å and 8.3946 Å, respectively, the measured values were considered to be consistent with the theoretical values. These measurement values are not expected to be found in the non-layered InSb having a zinc blende structure. In addition, given that the K ratio of the parent structure $K_2In_2Sb_3$ is 28.5 at % but the K ratio of the measured $Na_{2-x}Al_2Sb$ is 10.1 at %, it was confirmed that K was partially removed. Further, the measured pattern is a pattern that is only found in the space group of $P2_1/c$. In the SAED pattern, a zone-axis may be obtained through an outer product from a plane measured by patterns, and a vector obtained through an outer product of the (002) and (200) planes is [010]. Therefore, it was confirmed that the zone-axis was [010], and the lattice structure in the actually measured STEM image observed from the [010] zone and the shape of the theoretically obtained atomic structure model were exactly identical. Accordingly, it was confirmed that the material from which K was removed as well kept the $P2_1/c$ space group of the parent material $K_2In_2Sb_3$.

Figure 11A:
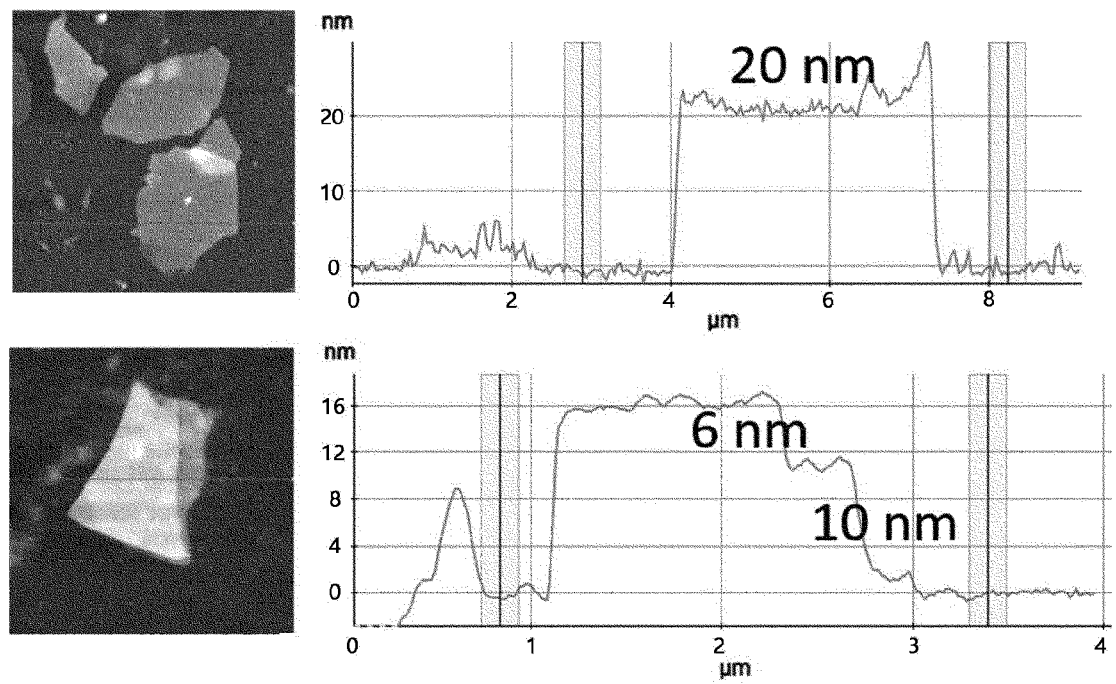
FIGS. 11A and 11B are results of analyzing electrical properties of samples according to Example 5 of the invention.

FIG. 11A shows an AFM image of a nanosheet prepared by being peeled off from Sample C in Example 5 and a line profile therefrom. It was confirmed that a nanosheet was peeled off to have a thickness of 20 nm or less.

Figure 11B:
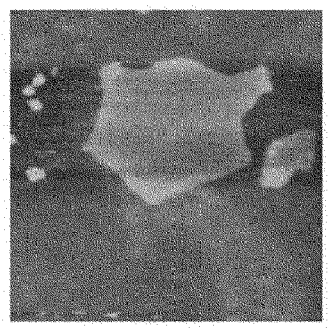
Figure 11B:
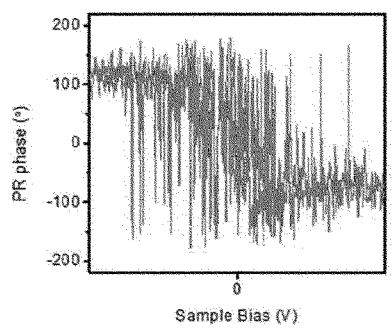
Figure 11B:
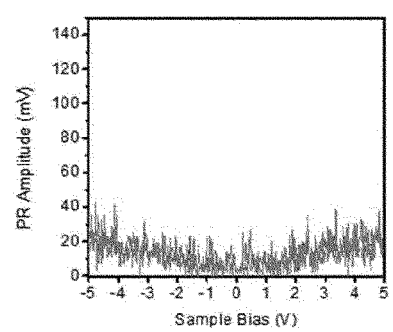
Figure 11B:
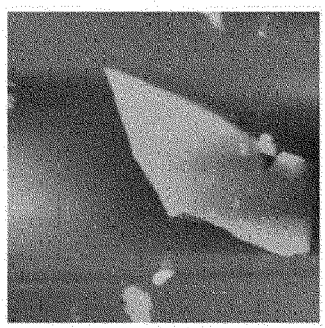
Figure 11B:
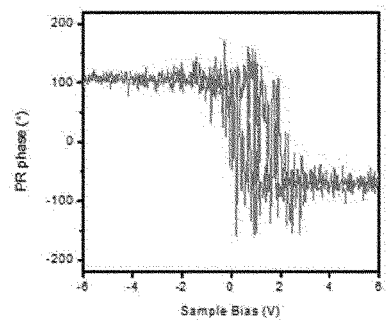
Figure 11B:
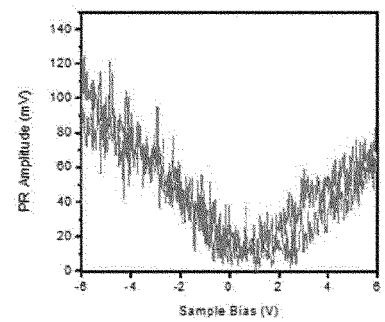

In addition, in FIG. 11B, the ferroelectric properties were measured through PFM after preparing a nanosheet for Sample A before the removal of K and Sample C after the removal of K in Example 5, and a hysteresis loop therefrom is shown. Before K was removed, ferroelectric properties were not observed, but in Sample C from which K was removed, ferroelectric properties were observed.

FIGS. 12A TO 14 show results of analyzing samples prepared according to Example 6.

Figure 12A:
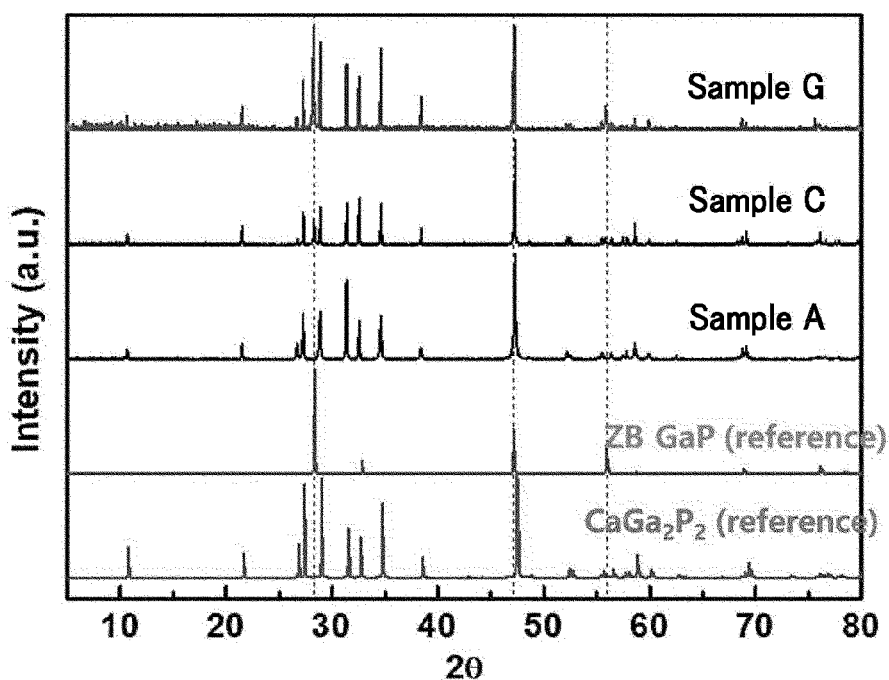
FIGS. 12A and 12B are results of analyzing samples according to Example 6 of the invention.

FIG. 12A shows peaks according to the reference data value of $CaGa_2P_2$, peaks according to the reference data value of GaP (F-43m space group) of the zinc blende structure in XRD analysis, and results of XRD analysis for Samples A, C, and G in Example 6. It was confirmed that with a decrease in the amount of Ca, the peaks corresponding to the zinc blende GaP that was not present in Sample A became greater. Accordingly, it is seen that the Ca fraction in the material decreases with an etching being performed, and in this process, the P63/mmc space group of $CaGa_2P_2$ gradually changed to GaP of the zinc blende structure having the F-43m space group.

However, even when changed to the zinc blende structure as such, the layered structure still stays as it is, because even when Ca positioned between the GaP layers is removed, the plane where Ca occupied still forms a cleavage plane or cracks.

Figure 12B:
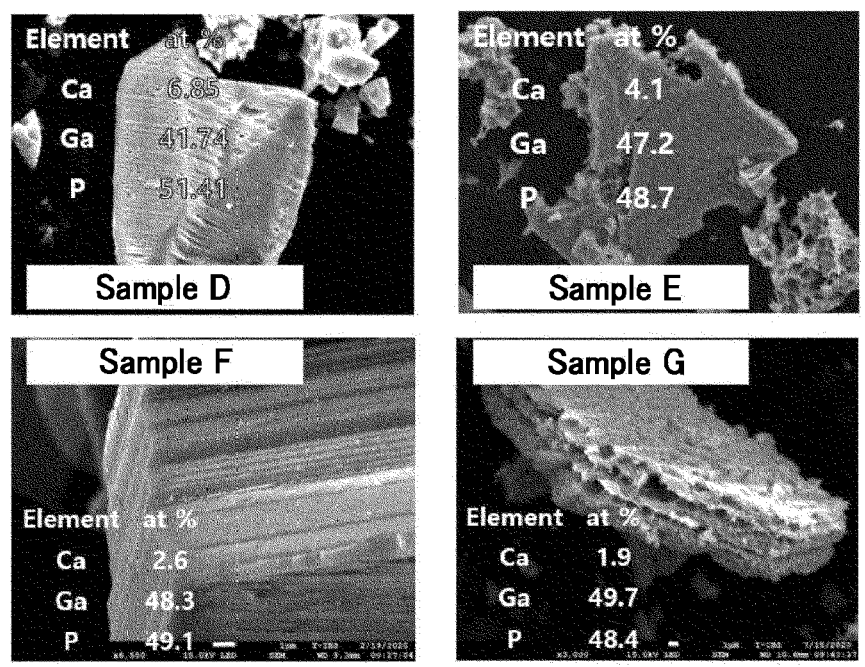

This change is shown in FIG. 12B, and it is seen that Samples D, E, F, and G all have a zinc blende structure, but still keep a layered structure as before the removal of Ca. In particular, in Sample G from which Ca was removed by the most amount, cracks were formed between the layers due to an increase in the interlayer distance, and the resulting sample is peeled off and dispersed to prepare nanosheets. The layer between cracks may include a plurality of GaP layers.

Figure 13:
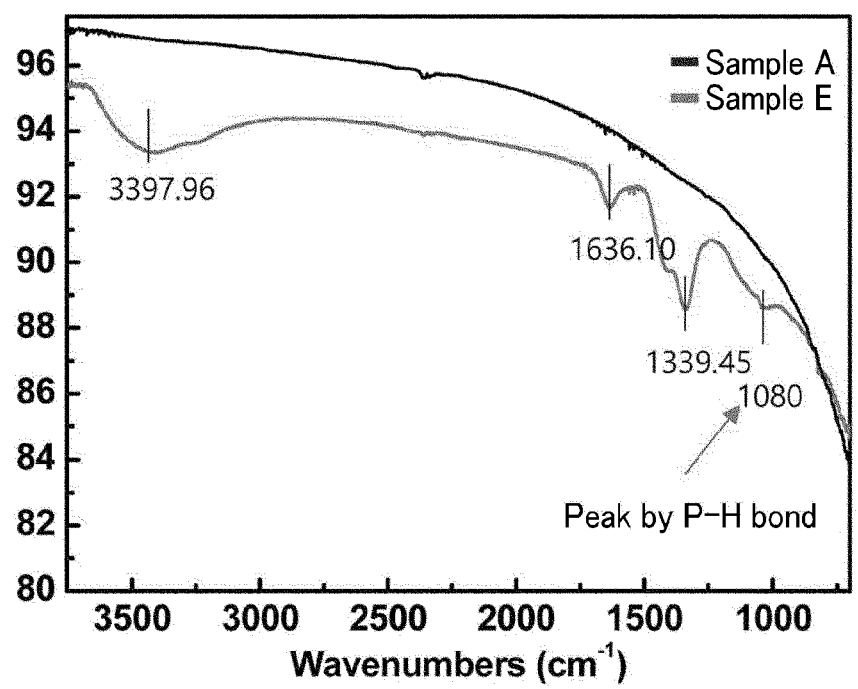
FIG. 13 is results of Fourier-transform infrared spectroscopy (FT-IR) analysis of samples according to Example 6 of the invention.

FIG. 13 shows results of Fourier-transform infrared spectroscopy (FT-IR) analysis, and Sample E from which Ca was removed with nitric acid in Example 6, showed peaks according to P—H bonds at the position of 1,080 $cm^{-1}$ in the range of 1,150 $cm^{-1}$ to 950 $cm^{-1}$, but the graph of Sample A, a layered compound before the additive elements were removed, showed no peaks in the wavelength range.

Figure 14:
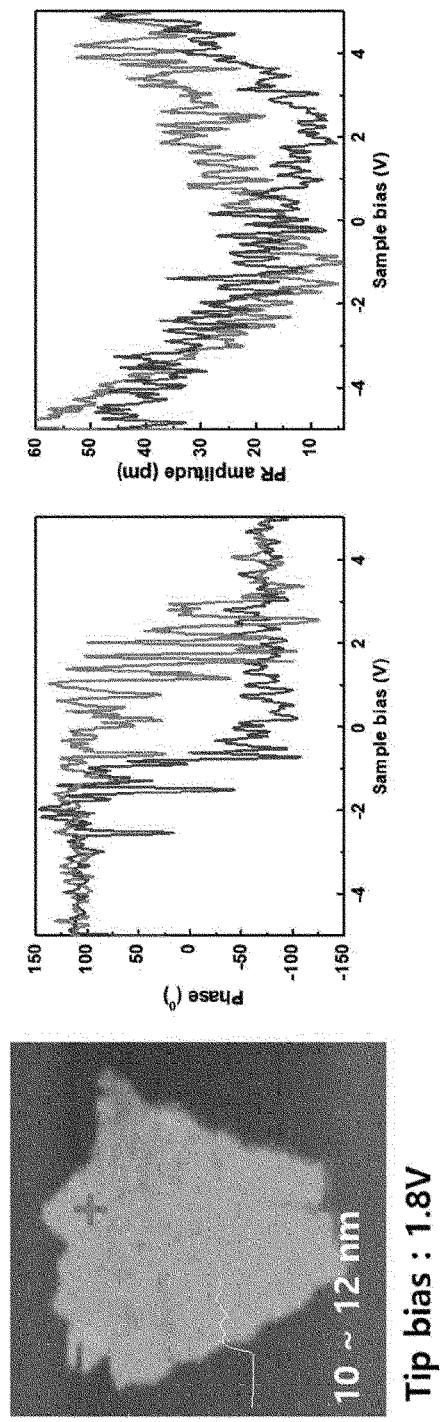
FIG. 14 is results of analyzing electrical properties of a sample according to Example 6 of the invention.

In FIG. 14, an AFM image of the nanosheet peeled off to 10 nm to 12 nm in Sample D is shown and the ferroelectric properties of the nanosheet were measured through PFM, and hysteresis curves therefrom are shown. It was found that the nanosheet had ferroelectric properties applicable to actual electrical devices having a coercive voltage of ±2V for each voltage direction.

FIGS. 15A to 16B show results of analyzing samples prepared according to Example 7.

Figure 15A:
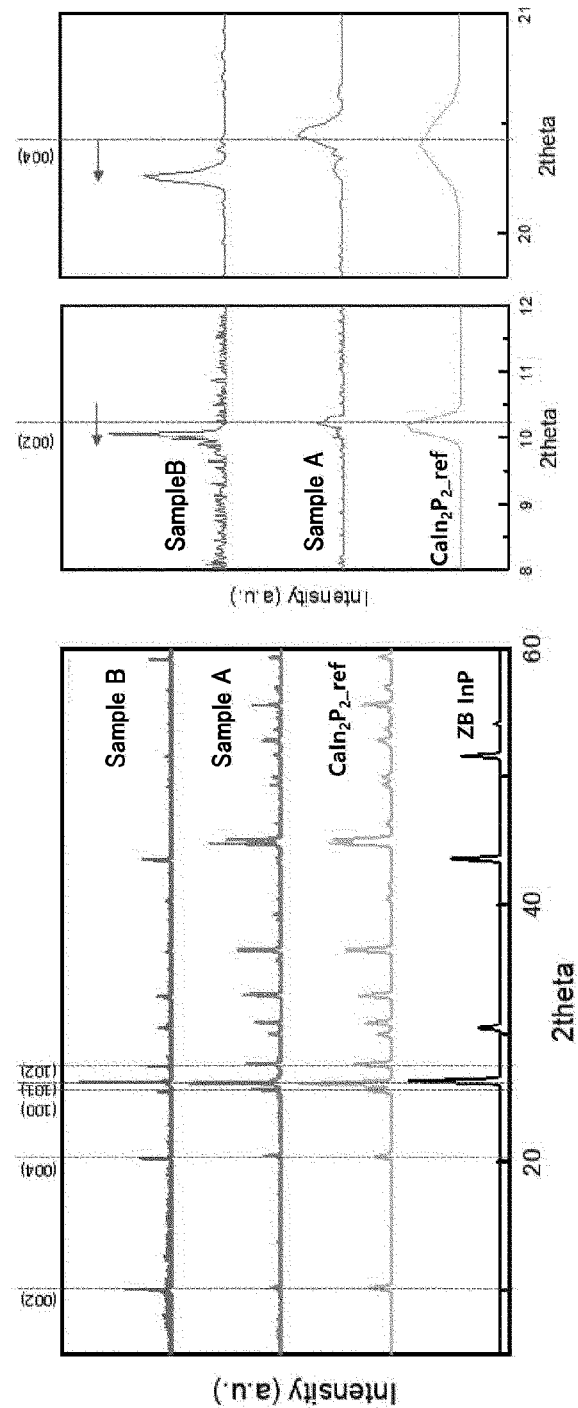
FIGS. 15A and 15B are results of analyzing samples according to Example 7 of the invention.

FIG. 15A is a graph showing patterns according to XRD analysis, and shows reference data peaks of InP (ZB InP) of a zinc blende structure, reference data peaks of $CaIn_2P_2$ ($CaIn_2P_2$_ref), and data peaks of Sample A of Example 7 (Sample A), and data peaks of Sample B (Sample B). The peaks on the (002) plane were not observed in ZB InP, and the peaks on the (002) plane in Sample B from which Ca was partially removed were observed to move to a low angle compared to the peaks on the (002) plane in Sample A before Ca was removed and the reference data of $CaIn_2P_2$. However, even in this case, the peaks were present, indicating that the crystal structure was kept even after Ca was partially removed.

Figure 15B:
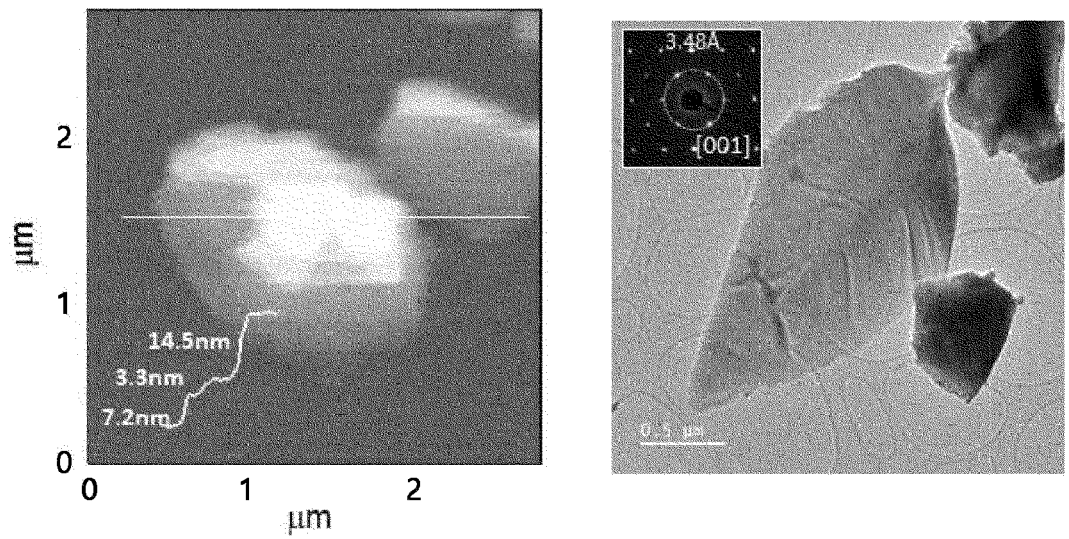

FIG. 15B shows an AFM image of a nanosheet peeled off from Sample B in Example 7 and a line profile therefrom, and TEM images and SAED patterns. It was seen through the AFM line profile and TEM images that Sample B was peeled off to turn into a thin two-dimensional nanosheet, and through the SAED patterns, it was seen that the nanosheet kept the [001] zone-axis of the P63/mmc structure.

Figure 16A:
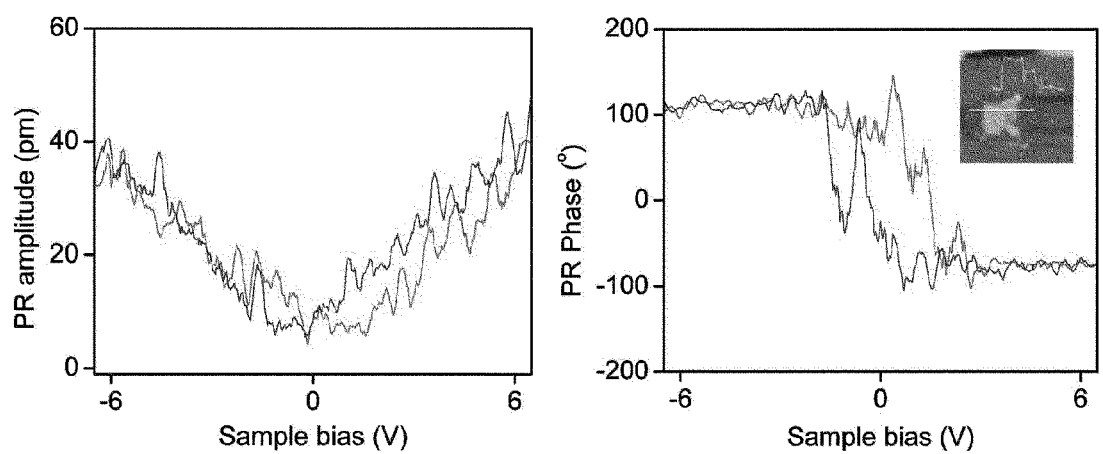
FIGS. 16A and 16B are results of analyzing electrical properties of a sample according to Example 7 of the invention.

In FIG. 16A, results of measuring ferroelectric properties through PFM in a nanosheet peeled off from Sample B and a hysteresis loop therefrom are shown. The nanosheet had ferroelectric properties applicable to actual electrical devices.

Figure 16B:
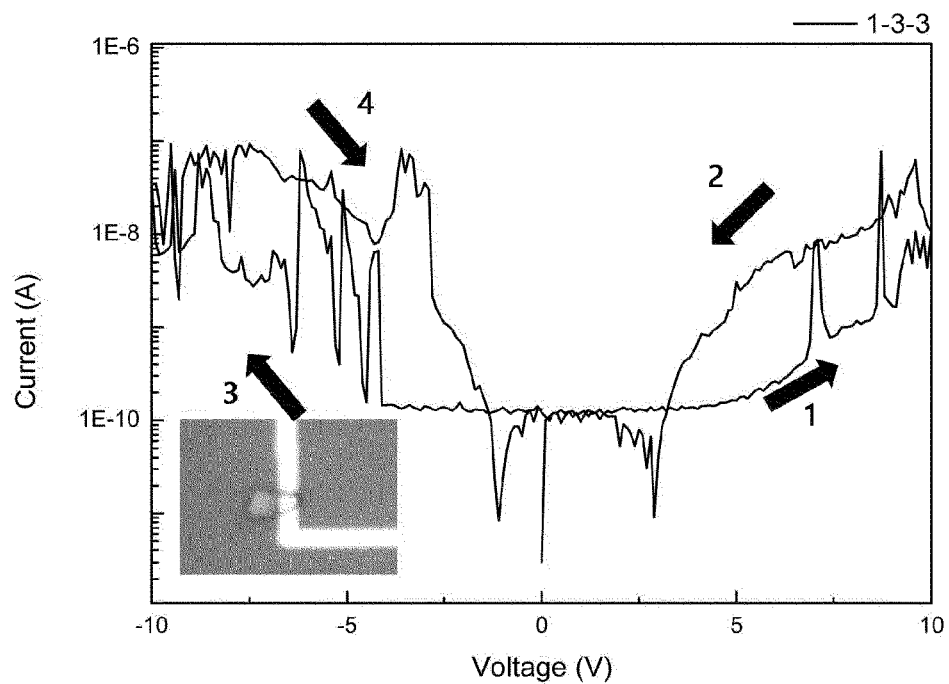

In addition, current changes according to voltages were measured for the nanosheet peeled off from Sample B, and results are shown in FIG. 16B. At an initial voltage, the nanosheet kept a high resistance state 1, indicating a low current flow, but when the voltage was greater than a certain level, the nanosheet switched to a low resistance state 2, indicating a sharp increase in the current to exhibit resistance switching properties.

FIGS. 17A to 25 show results of analyzing samples prepared according to Example 8.

Figure 17A:
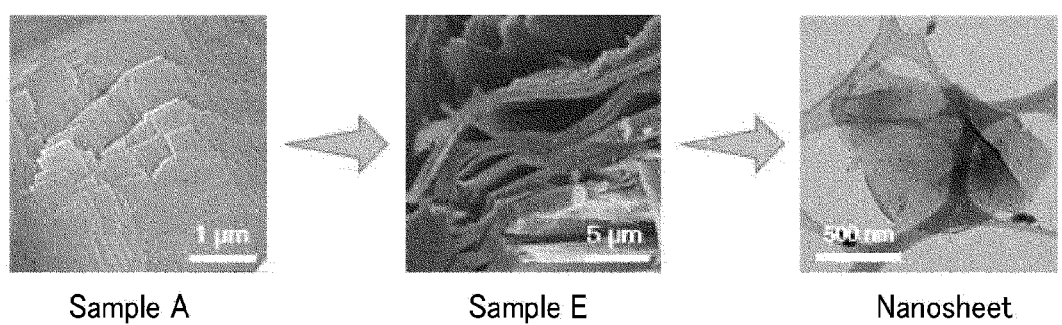
FIGS. 17A and 17B are results of analyzing samples according to Example 8 of the invention.

FIG. 17A shows a SEM image of layered compounds by phase and nanosheets in Example 8. Sample A, a layered compound before the removal of Ca, shows a layered structure, but the layers are in close contact with each other through Van der Waals bonds. However, Sample E, in which Ca was removed for 30 minutes in nitric acid, shows cracks between the layers due to an increase in the interlayer distance, and in the end, at this phase, a nanosheet peeled off therefrom is observed. The layer between cracks may include a plurality of GaN layers.

Figure 17B:
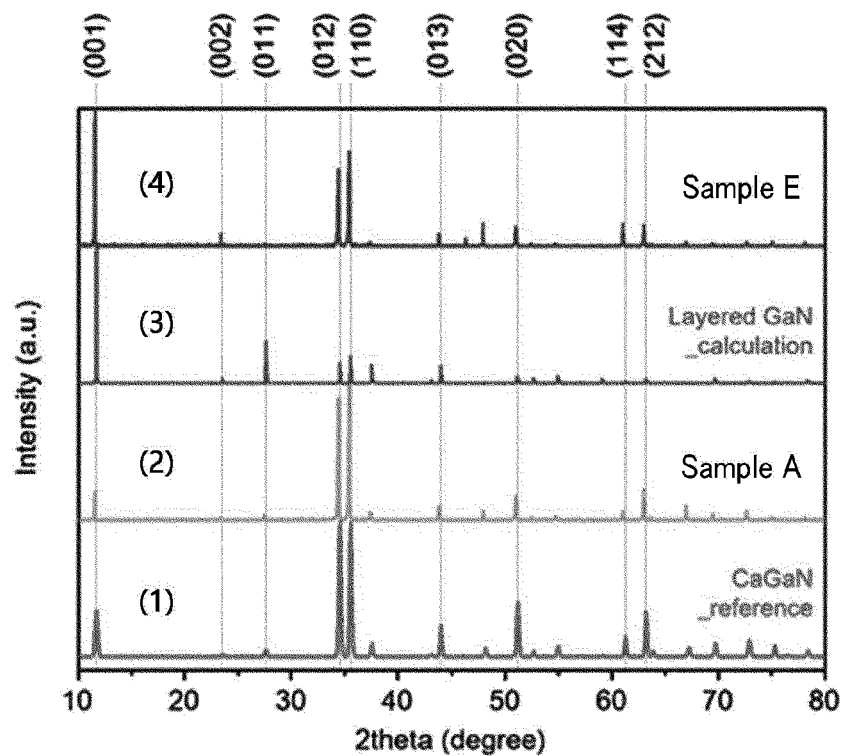

FIG. 17B shows peaks according to the reference data value of CaGaN (CaGaN_reference), measurements peak for Sample A, a layered CaGaN (Sample A), peaks according to calculation for a layered GaN (layered GaN_calculation), and measurement peaks (Sample E) for Sample E, a layered compound. Sample A, which is CaGaN before Ca was removed, exhibited peaks well consistent with the reference data value. It was observed that Sample E, a layered compound subjected to the process of removing Ca, also showed peaks at the same location when XRD was measured, indicating that the structure was kept as the location of the main peaks stayed the same despite the removal of Ca.

Figure 18A:
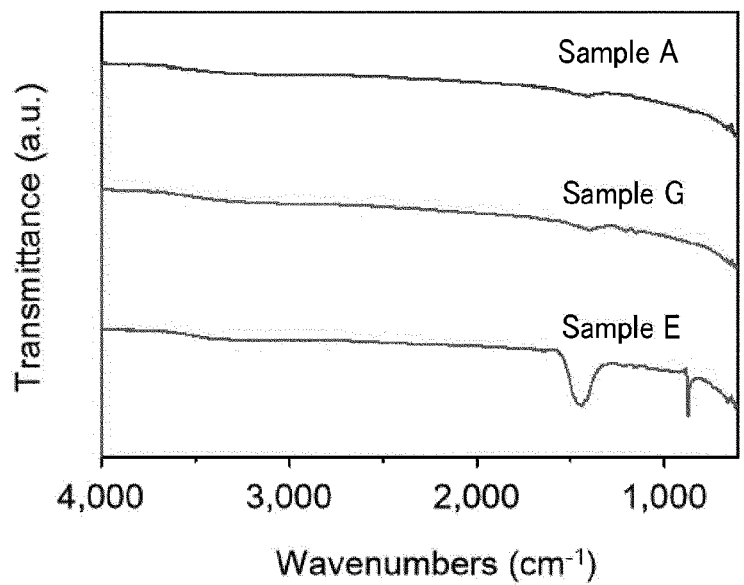
FIGS. 18A and 18B are results of FT-IR and X-ray photoelectron spectroscopy (XPS) analysis of a sample according to Example 8 of the invention.

FIG. 18 shows results of analyzing Samples A, G, and E according to Example 8. FIG. 18A shows results of FT-IR analysis for the layered compound according to an embodiment of the invention, and the graph showing the results of FT-IR analysis of Sample E from which Ca was removed using acid showed peaks according to N—H bonding at the position of 1,444 cm$^{-1}$ but the graph of Sample A, a layered compound before the removal of additive elements, and the graph of Sample G without having hydrogen through the removal of additive elements using iodine showed no peaks in the above wavelength range.

Figure 18B:
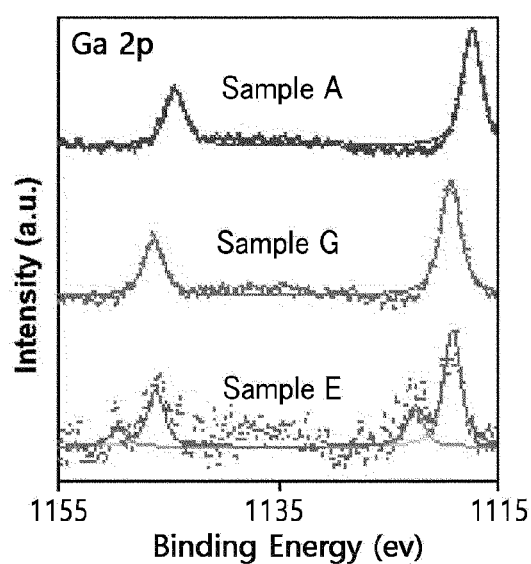

In addition, FIG. 18B shows results of XPS analysis, and the graph of showing XPS results of Sample A without the additive elements being removed and having hydrogen showed one peak in each of the binding energy sections in the range of 1,140 eV to 1,155 eV and 1,115 eV to 1,125 eV, whereas in Sample G without having hydrogen through the removal of additive elements using iodine, the binding energy sections in which the peaks were observed slightly changed, but similarly, only one peak was found in each of the above ranges. However, the graph showing XPS results of Sample E having hydrogen ions through the removal of Ca in nitric acid for 30 minutes showed a small peak again at 1,149.5 eV next to a peak at 1,146.1 eV, and a small peak at 1122.6 eV next to a peak at 1119.3 eV. These peak shoulders indicate the presence of hydrogen. The results of FIG. 18 are equally observed in the nanosheets prepared from the layered compound.

Figure 19:
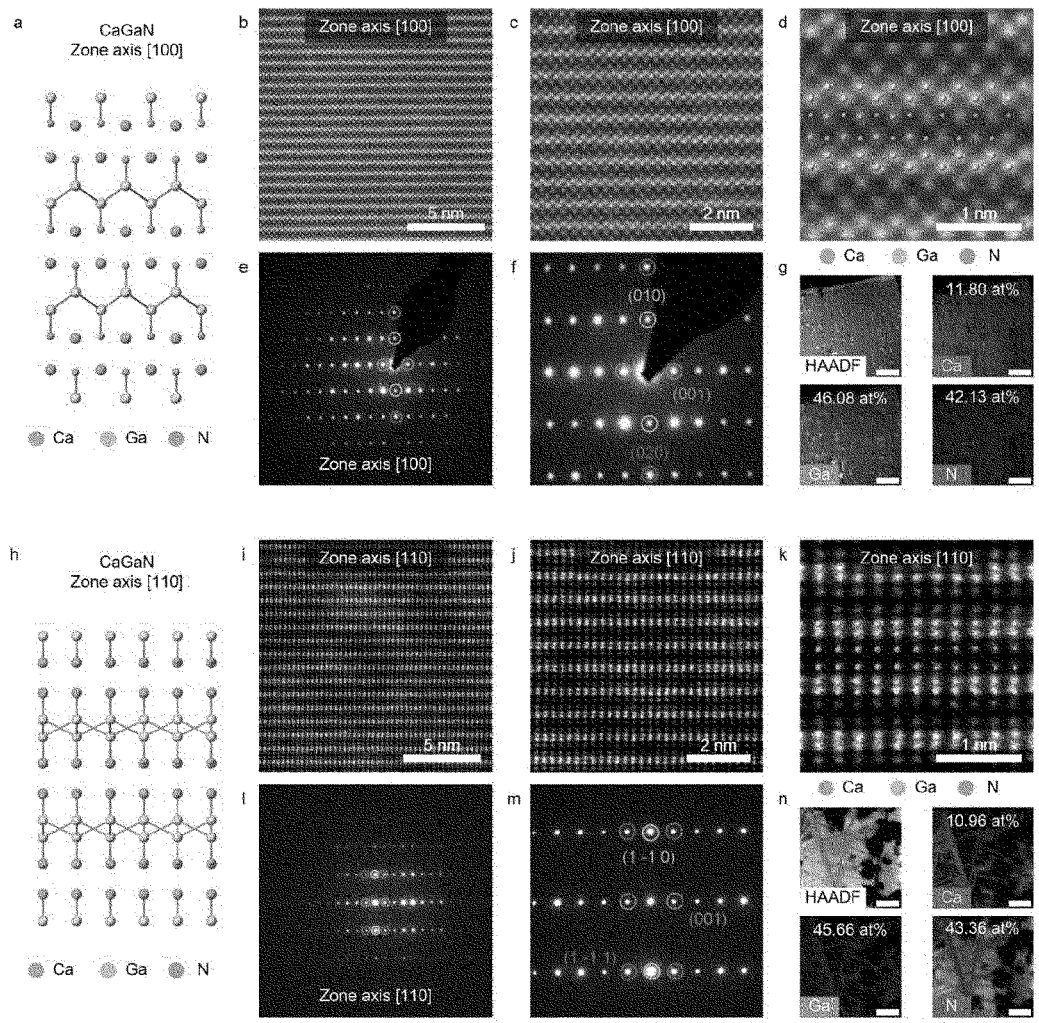
FIG. 19 is images illustrating results of scanning transmission electron microscopy (STEM) and energy dispersive X-ray spectroscopy (EDS) analysis of samples according to Example 8 of the invention.

FIG. 19 is results of STEM analysis of Sample E from which Ca was partially removed in Example 8. Analysis in [100] and [110] zone-axis was performed, and it was confirmed that the CaGaN structure forming a two-dimensional layer was well kept. Quantitative elemental composition ratios were confirmed through transmission electron microscopy-energy dispersive spectroscopy (TEM-EDS) mapping, and the analysis results showed that Ca was 11.8 at % and 10.96 at %, which were approximately the composition ratios of $Ca_{0.25}GaN$.

Figure 20:
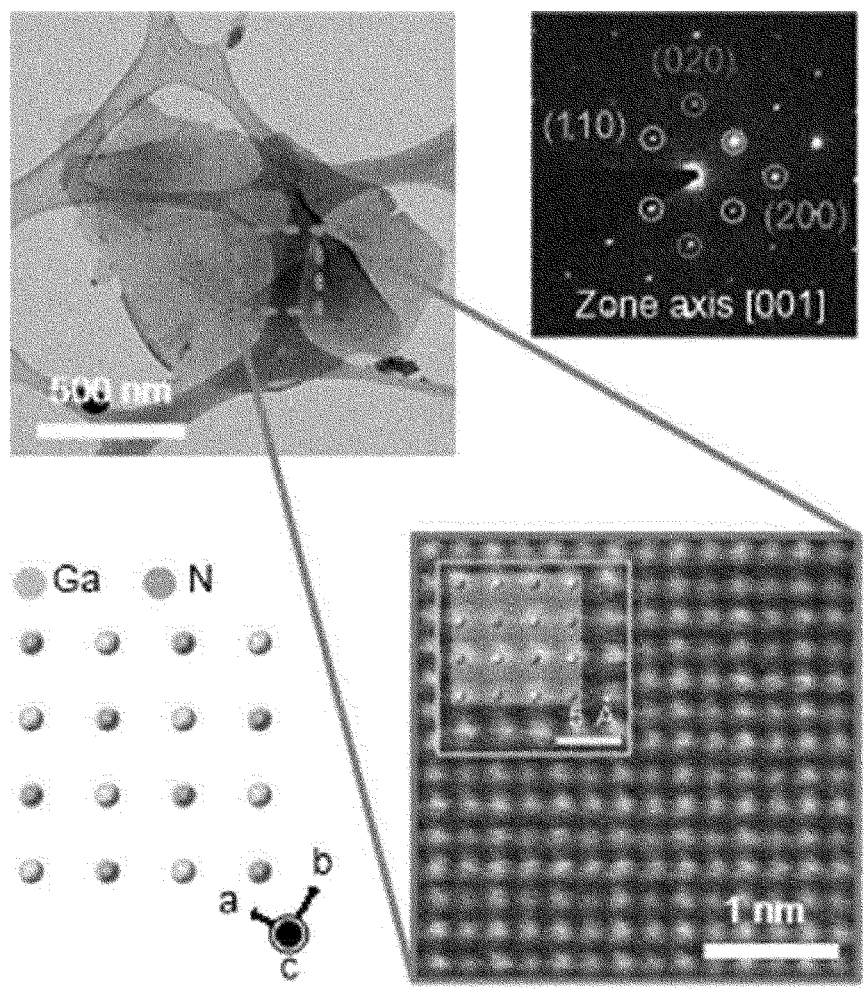
FIG. 20 is images illustrating results of STEM and focused ion beam (FIB) analysis of samples according to Example 8 of the invention.

As such, the crystallinity of the actual atomic structure was confirmed through STEM analysis of the nanosheet prepared by peeling off Sample E from which Ca was removed for 30 minutes in nitric acid. As shown in FIG. 20, it was confirmed that the crystallinity of the actual atomic structure had the same tetragonal structure as the layered compound before peeling through electron diffraction (ED) pattern analysis, and it was confirmed that the atomic structure was also the same as the layered compound before peeling.

Figure 21:
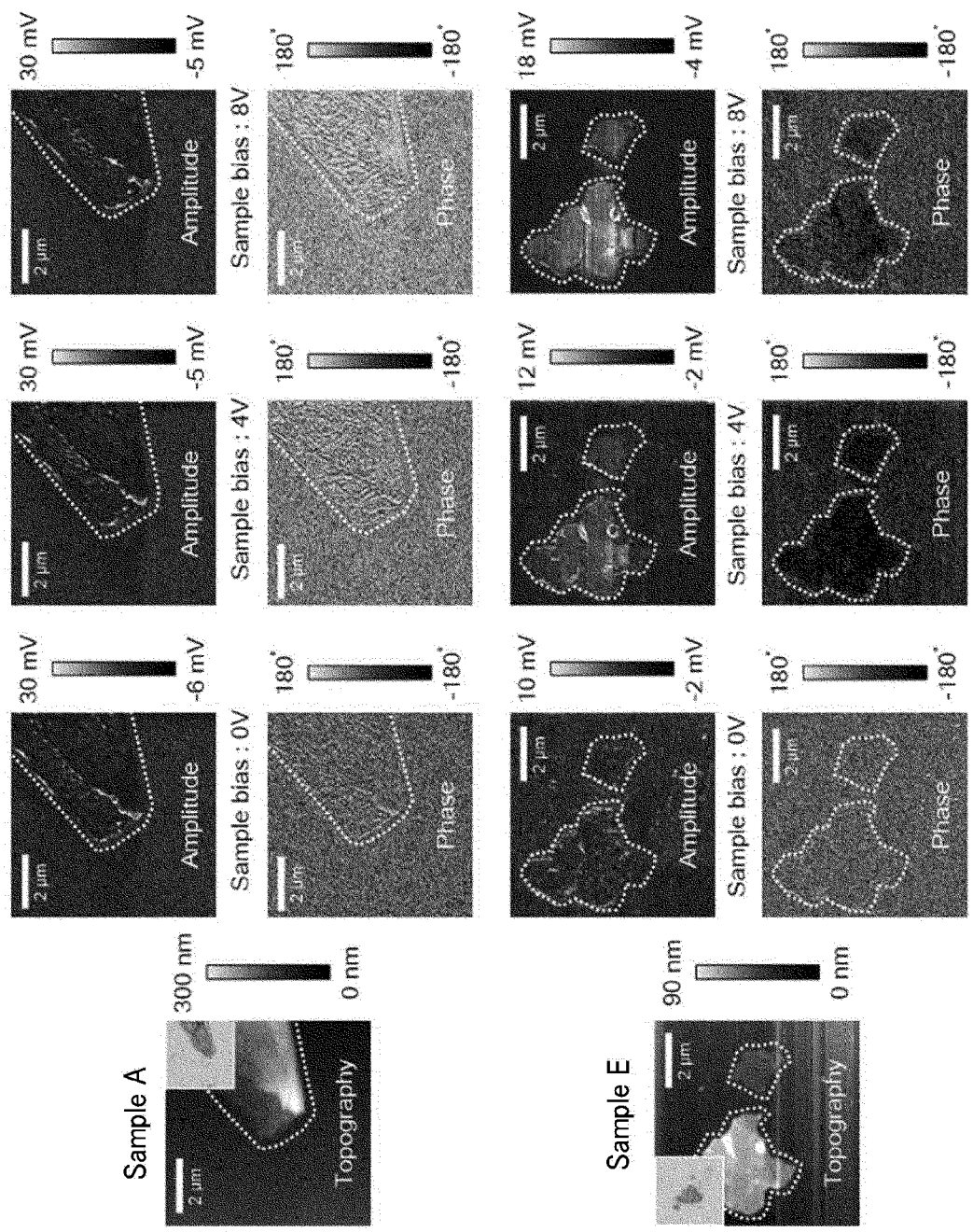
FIG. 21 is images illustrating results of sample mapping through piezoelectric force microscopy (PFM) according to Example 8 of the invention.
Figure 23:
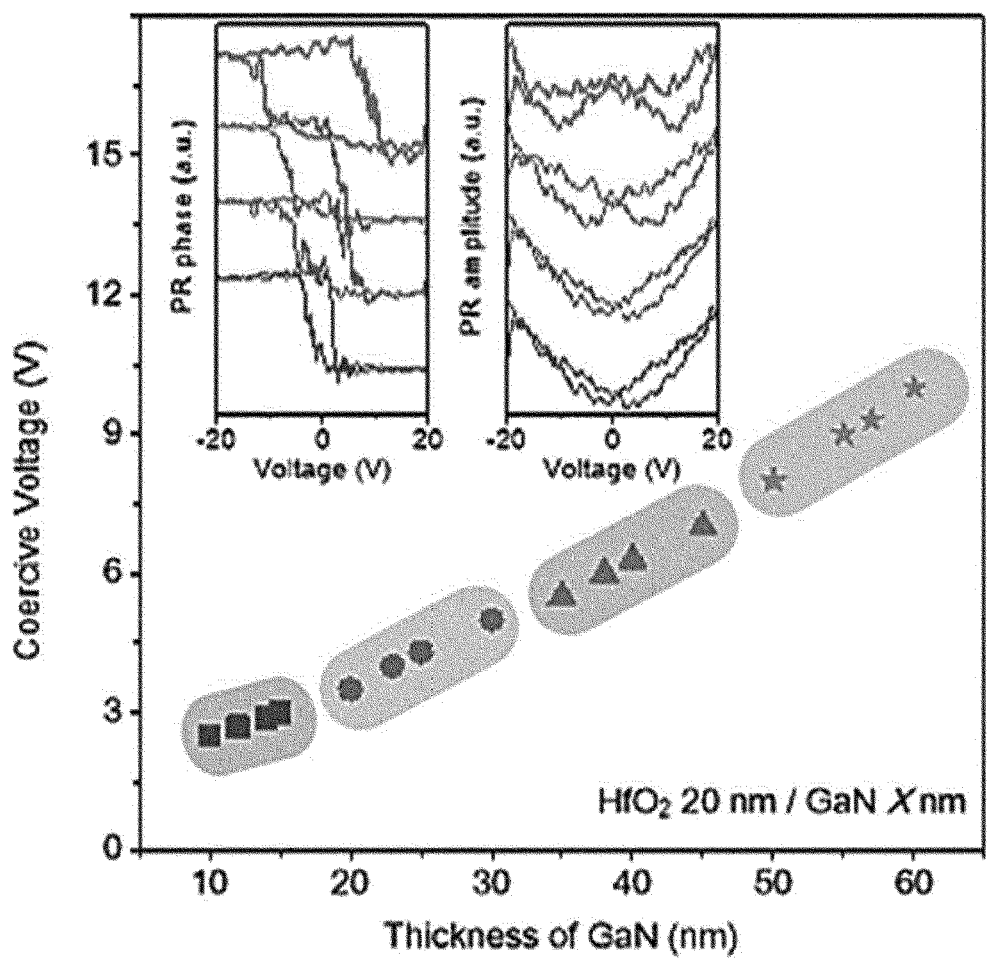
FIG. 23 is a graph illustrating results of measuring hysteresis curves and a coercive electric field according to a thickness of samples according to Example 8 of the invention.

In FIG. 21, the presence or absence of a change in piezoelectric properties was confirmed through PFM analysis for Sample A, which is CaGaN before Ca was removed, and Sample E having a layered structure from which Ca was partially removed. FIG. 23 shows results of the PFM mapping analysis, and through the analysis, it was found that a piezoelectric reaction was not observed in Sample A, a sample before the removal of Ca, but the piezoelectric reaction was clearly observed in Sample E from which Ca was partially removed.

Figure 22:
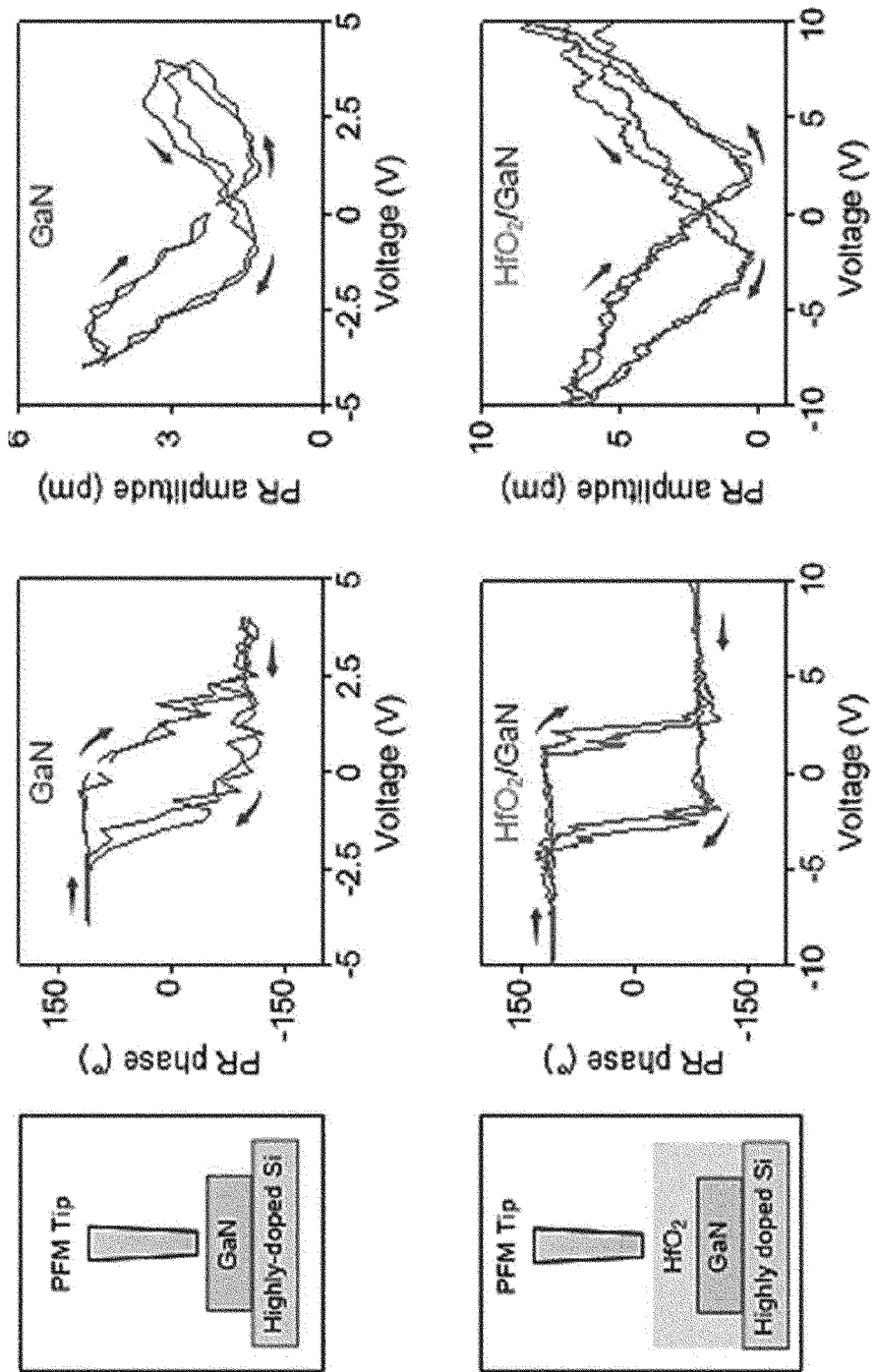
FIG. 22 is a graph illustrating results of measuring hysteresis curves of samples according to Example 8 of the invention.

In FIG. 22, a hysteresis loop was measured through PFM for sample E of a layered structure in which Ca was partially removed, and as a result, a hysteresis loop was shown according to applied voltages.

In FIG. 23, changes in coercive voltage according to a thickness of the nanosheet peeled off from the layered Sample E were analyzed, and the results confirmed that hysteresis loop signals had a dependence on the thickness of the sample.

As such, results of measuring the piezoelectric properties and hysteresis loop in FIGS. 21 to 23 indicated that the layered $Ca_{1-x}GaN$ compound had ferroelectric properties.

Analysis was performed to find out whether resistance switching properties are exhibited using these ferroelectric-like properties. To this end, as shown in FIG. 24, a gold electrode was disposed on a silicon substrate and a nanosheet peeled off from Sample E was disposed therebetween, and resistance was measured while applying voltages to the electrode.

Figure 24:
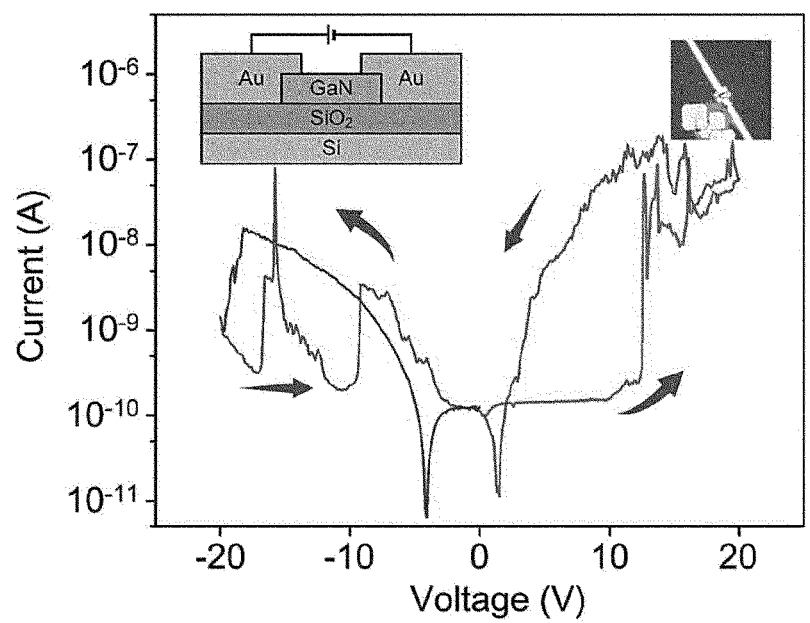
FIG. 24 is a graph of voltage-current properties of samples according to Example 8 of the invention.

As shown in FIG. 24, at an initial voltage, the layered $Ca_{1-x}GaN$ compound kept a high resistance state, indicating a low current flow, but when the voltage was greater than a certain level, the layered $Ca_{1-x}GaN$ compound switched to a low resistance state, indicating a sharp increase in the current. It was seen that the resistance state switched at the opposite voltage as well, indicating the resistance switching properties.

Figure 25:
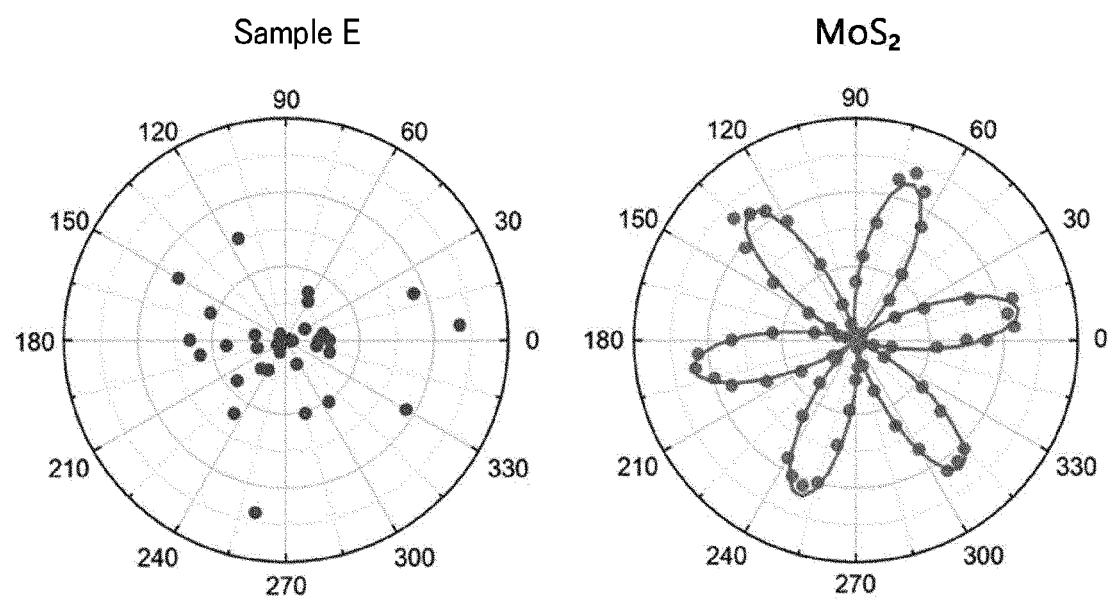
FIG. 25 is results of second-harmonic generation (SHG) measurement for samples and $MoS_2$ according to Example 8 of the invention.

Meanwhile, FIG. 25 shows results of Second-Harmonic Generation (SHG) measurement for Sample E of Example 8 and a $MoS_2$ compound having an asymmetric structure for comparison. According to the results, it is seen that the $MoS_2$ compound has an asymmetric structure, whereas Sample E has a polar-symmetry structure. As such, Sample E of Example 8 exhibited ferroelectric-like properties despite having a polar-symmetry structure.

What is claimed is:

1. A nanosheet having ferroelectric-like properties, comprising two or more two-dimensional layers, and represented by Formula 1 below:

$$M_{x-m}A_yB_z$$

wherein M is at least one of Group I or Group II elements, A is at least one of Group III elements, B is at least one of Group V elements, x, y, and z are positive numbers which are determined according to stoichiometric ratios to ensure charge balance when m is 0, and wherein the m satisfies $0<m<x$.

2. The nanosheet according to claim 1, wherein the m satisfies $0.1x \leq m \leq 0.9x$.

3. The nanosheet according to claim 1, wherein the m satisfies $0.25x \leq m \leq 0.9x$.

4. The nanosheet according to claim 1, wherein the nanosheet further comprises H.

5. The nanosheet according to claim 1,
wherein the nanosheet has a composition represented by Formula 2 below:

$$M_{x-m}H_nA_yB_z$$

wherein M is at least one of Group I or Group II elements, A is at least one of Group III elements, B is at least one of Group V elements, x, y, and z are positive numbers which are determined according to stoichiometric ratios to ensure charge balance when m is 0, and wherein the m satisfies 0<m<x, and the n satisfies 0<n≤m).

6. The nanosheet according to claim 1,
wherein the nanosheet has a polar-symmetry structure.

7. The nanosheet according to claim 1,
wherein the nanosheet exhibits resistance switching properties.

8. The nanosheet according to claim 1,
wherein the nanosheet has a thickness of 500 nm or less.

\* \* \* \* \*